(12) United States Patent
Ohchi

(10) Patent No.: US 11,793,036 B2
(45) Date of Patent: Oct. 17, 2023

(54) DISPLAY DEVICE AND ELECTRONIC APPARATUS WITH LIGHT EMITTING UNIT PARTITION WALL INSULATION LAYERS HAVING DIFFERENT REFRACTIVE INDICES

(71) Applicant: Sony Semiconductor Solutions Corporation, Kanagawa (JP)

(72) Inventor: Tomokazu Ohchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/745,299

(22) Filed: May 16, 2022

(65) Prior Publication Data
US 2022/0336553 A1    Oct. 20, 2022

Related U.S. Application Data

(63) Continuation of application No. 16/629,163, filed as application No. PCT/JP2018/024324 on Jun. 27, 2018, now Pat. No. 11,367,763.

(30) Foreign Application Priority Data

Jul. 14, 2017 (JP) ................. 2017-137970

(51) Int. Cl.
*H10K 59/122* (2023.01)
*H10K 50/856* (2023.01)
*H10K 59/38* (2023.01)

(52) U.S. Cl.
CPC ......... *H10K 59/122* (2023.02); *H10K 50/856* (2023.02); *H10K 59/38* (2023.02)

(58) Field of Classification Search
CPC ..... H10K 59/122; H10K 50/856; H10K 59/38
See application file for complete search history.

(56) References Cited

U.S. PATENT DOCUMENTS

| | | | |
|---|---|---|---|
| 11,367,763 B2* | 6/2022 | Ohchi | ................. H10K 59/122 |
| 2014/0027735 A1* | 1/2014 | Kim | ...................... H10K 71/00 |
| | | | 257/40 |
| 2014/0353630 A1 | 12/2014 | Baek et al. | |
| 2015/0115278 A1* | 4/2015 | Ichikawa | ................ H01L 33/22 |
| | | | 257/98 |

(Continued)

FOREIGN PATENT DOCUMENTS

| | | |
|---|---|---|
| CN | 101764147 A | 6/2010 |
| JP | 2007-248484 A | 9/2007 |

(Continued)

*Primary Examiner* — Nduka E Ojeh
(74) *Attorney, Agent, or Firm* — Michael Best & Friedrich LLP

(57) ABSTRACT

Display devices and electronic apparatus are disclosed. In one example, a display device includes first and second light emitting units on a substrate, with each of them including a first electrode, an organic later and a second electrode. A partition wall is located between the first electrode of the first light emitting unit and the first electrode of the second light emitting unit, wherein the partition wall includes a first insulating layer and a second insulating layer disposed on the first insulating layer, with a refractive index of the first insulating layer is higher than a refractive index of the second insulating layer.

18 Claims, 25 Drawing Sheets

(56) References Cited

U.S. PATENT DOCUMENTS

| | | | |
|---|---|---|---|
| 2015/0188091 A1* | 7/2015 | Kudo | G06F 30/00 |
| | | | 703/1 |
| 2015/0188093 A1 | 7/2015 | Kim | |
| 2017/0179437 A1 | 6/2017 | Kim et al. | |
| 2018/0122875 A1* | 5/2018 | Bang | H10K 59/1213 |
| 2018/0190740 A1* | 7/2018 | Bang | H10K 50/856 |
| 2018/0226016 A1* | 8/2018 | Suzuki | G09G 3/3208 |

FOREIGN PATENT DOCUMENTS

| | | |
|---|---|---|
| JP | 2013-191533 A | 9/2013 |
| JP | 2017026973 A | 2/2017 |

* cited by examiner

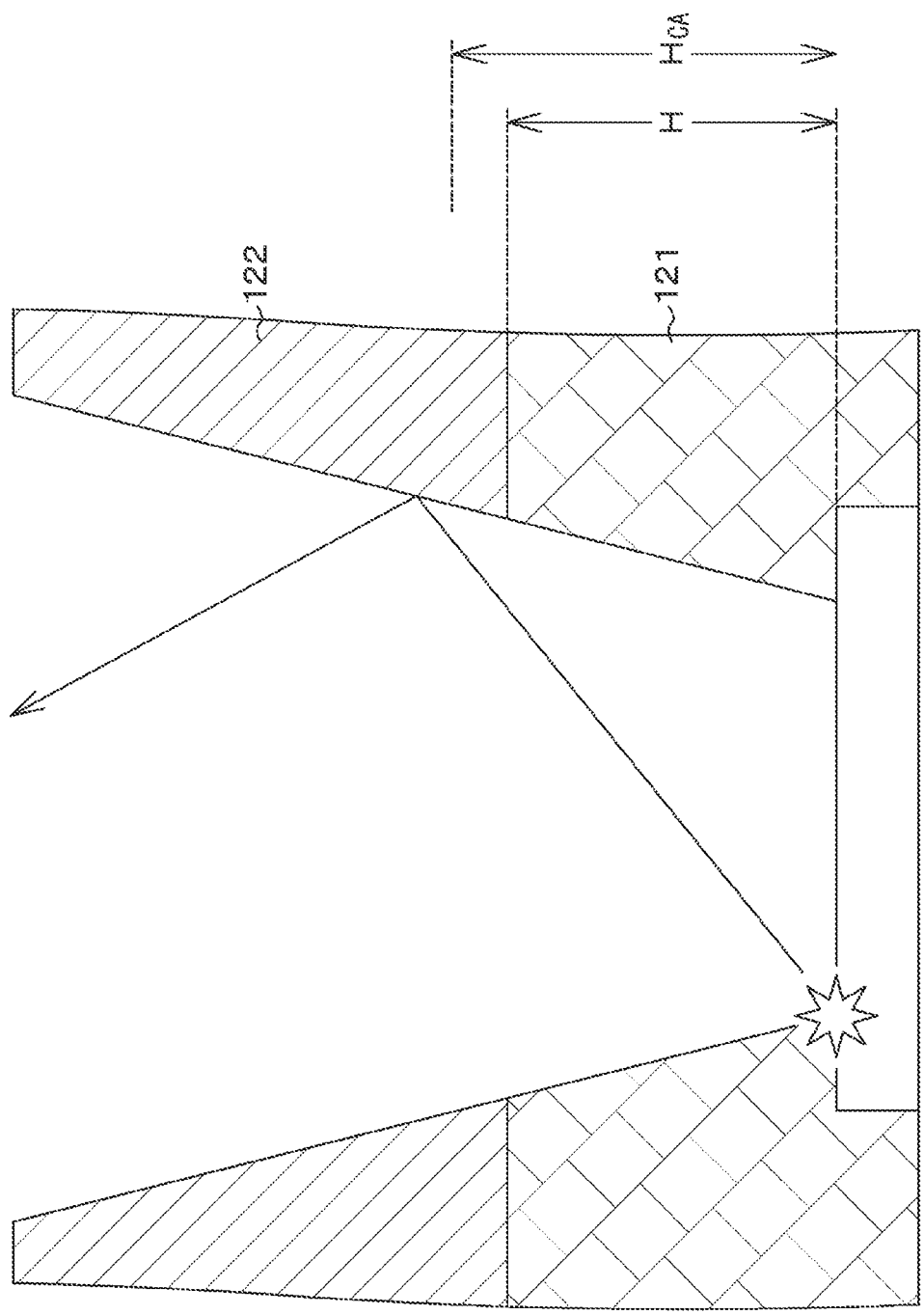

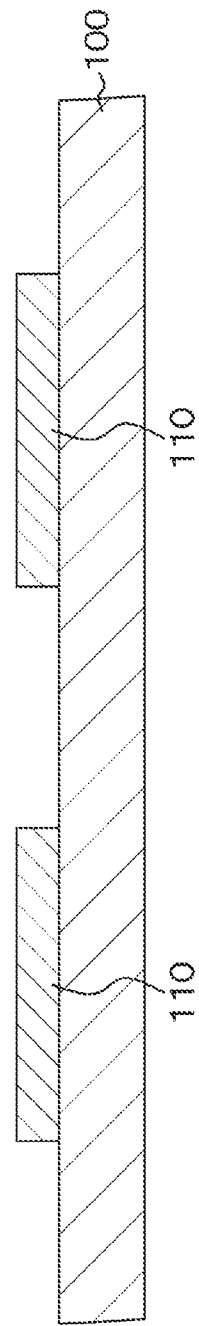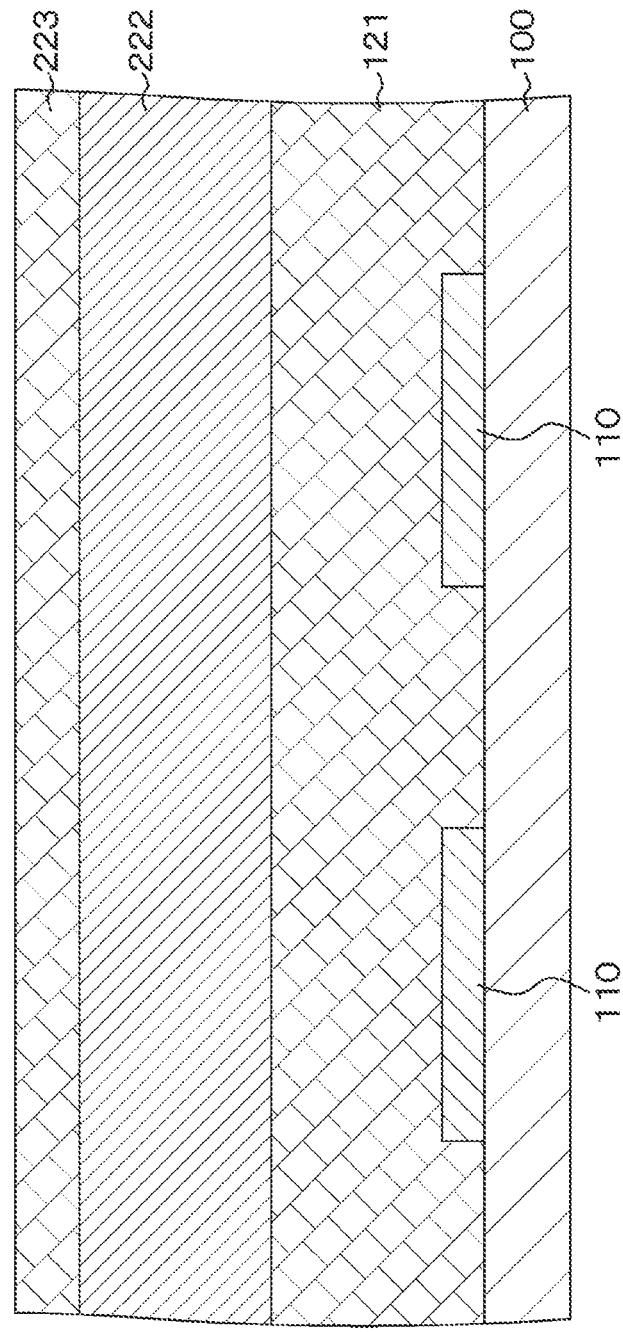

DISPLAY DEVICE AND ELECTRONIC APPARATUS WITH LIGHT EMITTING UNIT PARTITION WALL INSULATION LAYERS HAVING DIFFERENT REFRACTIVE INDICES

CROSS REFERENCE TO RELATED APPLICATIONS

The present application is a Continuation of application Ser. No. 16/629,163, filed Jan. 7, 2020, which is a 371 National Stage Entry of International Application No.: PCT/JP2018/024324, filed on Jun. 27, 2018, which claims the benefit of Japanese Priority Patent Application JP 2017-137970 filed Jul. 14, 2017, the entire contents of which are incorporated herein by reference.

TECHNICAL FIELD

The present disclosure relates to a display device and an electronic apparatus.

BACKGROUND ART

In recent years, display devices using organic electroluminescence have been attracting attention as display devices to replace liquid crystal display devices. In the description below, a display device using organic electroluminescence will be referred to as "organic EL display devices" or simply as "display devices" in some cases. Organic EL display devices are spontaneous-luminescence devices, and have sufficiently high responsiveness to high-definition, high-speed video signals. Therefore, commercialization of such devices has been actively promoted.

In a display device to be attached to eyewear such as glasses or goggles, it is required to increase luminance, in addition to setting the pixel size to several to ten microns, for example. For example, Japanese Patent Application Laid-Open No. 2007-248484 (Patent Document 1) and Japanese Patent Application Laid-Open No. 2013-191533 (Patent Document 2) disclose that light is totally reflected by a partition wall separating a light emitting unit from another light emitting unit so that the light extraction efficiency and the luminance are increased.

CITATION LIST

Patent Documents

Patent Document 1: Japanese Patent Application Laid-Open No. 2007-248484
Patent Document 2: Japanese Patent Application Laid-Open No. 2013-191533

SUMMARY OF THE INVENTION

Problems to be Solved by the Invention

In a case where light is reflected through total reflection, it is necessary to form the partition walls with a material having a low refractive index, such as silicon oxide. However, leakage paths are formed in the vicinities of the contact surfaces between the partition walls and the light emitting layers, and, as a result, a phenomenon such as a decrease in luminance or a decrease in reliability due to leakage between adjacent pixels might occur.

Therefore, an object of the present disclosure is to provide a display device capable of reducing leakage between adjacent pixels without significantly impairing light extraction efficiency, and an electronic apparatus including the display device.

Solutions to Problems

A display device according to a first aspect of the present disclosure for achieving the above object is a display device including
light emitting units each formed by stacking a first electrode, an organic layer, and a second electrode, the light emitting units being formed and arranged in a two-dimensional matrix on a substrate, in which
the first electrode is provided for each light emitting unit,
partition walls are formed between adjacent ones of the first electrodes,
the organic layer and the second electrode are stacked on the entire surface including a part over the first electrodes and a part over the partition walls,
a filling layer filling recesses between the partition walls is formed on the second electrode,
the partition walls include stacks each including at least two layers including a lower layer portion on the light emitting unit side and an upper layer portion located above the lower layer portion, and
at least part of light entering from the light emitting units is totally reflected on surfaces of the upper layer portions of the partition walls.

An electronic apparatus according to the first aspect of the present disclosure for achieving the above object is an electronic apparatus including a display device, in which
the display device includes
light emitting units each formed by stacking a first electrode, an organic layer, and a second electrode, the light emitting units being formed and arranged in a two-dimensional matrix on a substrate,
partition walls are formed between adjacent ones of the light emitting units,
a protective layer fills spaces between the partition walls,
the partition walls include stacks each including at least two layers including a lower layer portion on the light emitting unit side and an upper layer portion located above the lower layer portion, the lower layer portion including a material having a higher refractive index than the material forming the upper layer portion, and
at least part of light from the light emitting units is totally reflected on surfaces of the upper layer portions of the partition walls.

Effects of the Invention

In a display device according to the first aspect of the present disclosure, partition walls each include a stack of two or more layers including a lower layer portion on the light emitting unit side and an upper layer portion located above the lower layer portion. A material that hardly form leakage paths in the vicinities of the contact surfaces of the light emitting layers can be selected as the material forming the lower layer portions. Further, as light is totally reflected on the upper layer portions of the partition walls, light extraction efficiency is not significantly impaired. In addition, note that the advantageous effects described in the present disclosure are merely an example, and the effects of the present technology are not limited to the example and may also include additional effects.

BRIEF DESCRIPTION OF DRAWINGS

FIG. 9 is a schematic diagram for explaining a partition structure in the display device according to the first embodiment.

FIGS. 20A and 20B are schematic partial end views for explaining a method of manufacturing the display device according to the second embodiment.

FIG. 23 is an external view of a single-lens reflex digital still camera with an interchangeable lens.

MODE FOR CARRYING OUT THE INVENTION

Figure 1:
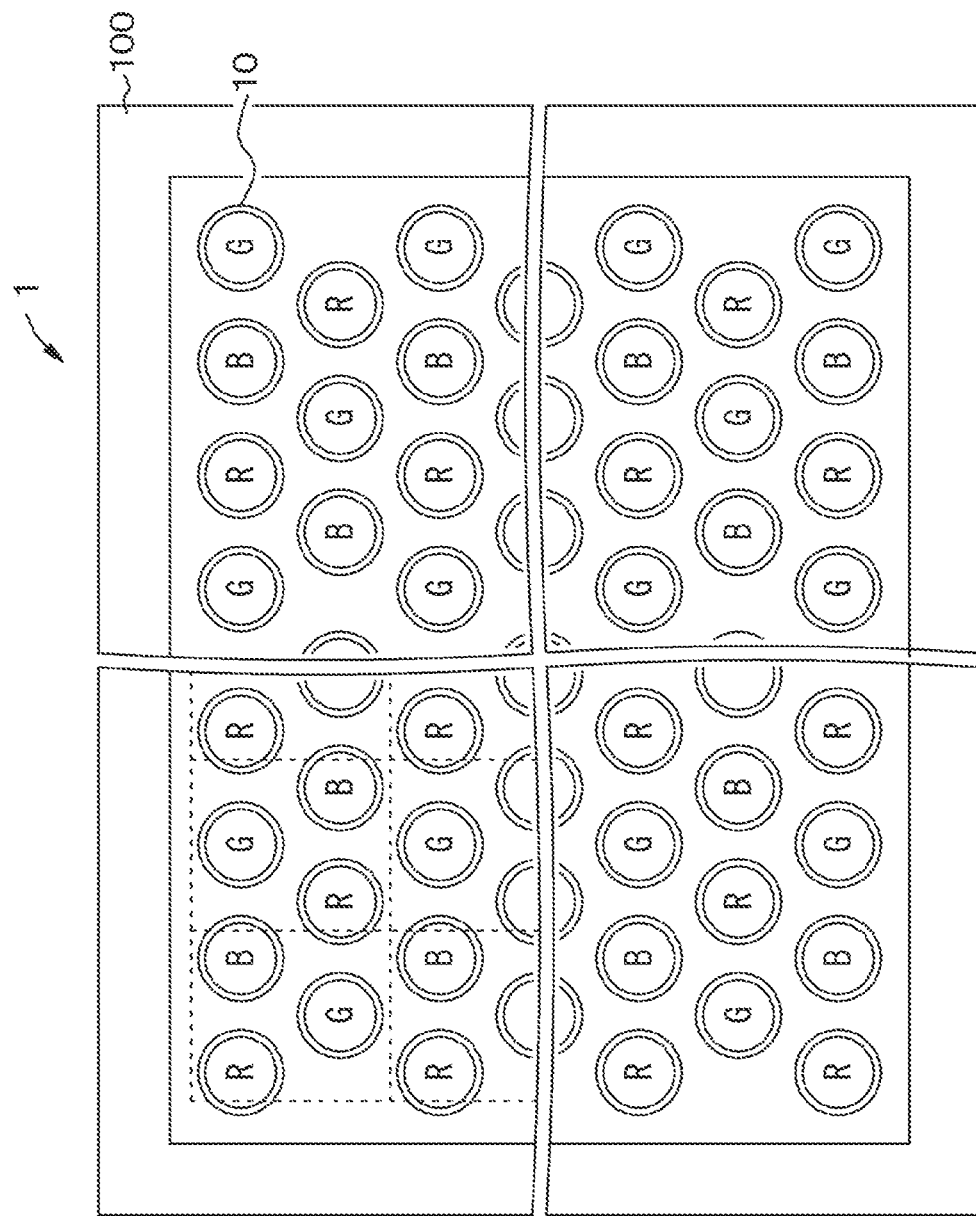
FIG. 1 is a schematic plan view of a display device according to a first embodiment of the present disclosure.

The following is a description of the present disclosure based on embodiments, with reference to the drawings. The present disclosure is not limited to the embodiments, and various numerical values and materials used in the embodiments are examples. In the description below, like components or components having like functions are denoted by like reference numerals, and explanation of them will not be unnecessarily repeated. Note that explanation will be made in the following order.

1. General description of a display device and an electronic apparatus according to the present disclosure
2. First Embodiment
3. Second Embodiment
4. Third Embodiment
5. Explanation of electronic apparatuses, and other aspects

[General Description of a Display Device and an Electronic Apparatus According to the Present Disclosure]

As described above, in a display device according to the first aspect of the present disclosure, and in a display device to be used in an electronic apparatus according to the first aspect of the present disclosure (each of these display devices will be hereinafter referred to simply as a "display device of the present disclosure" in some cases), light emitting units each formed by stacking a first electrode, an organic layer, and a second electrode are formed and arranged in a two-dimensional matrix on a substrate, the first electrode is provided for each light emitting unit, partition walls are formed between adjacent ones of the first electrodes, the organic layer and the second electrode are stacked on the entire surface including a part over the first electrodes and a part over the partition walls, a filling layer filling recesses between the partition walls is formed on the second electrode, the partition walls include stacks each including at least two layers including a lower layer portion on the light emitting unit side and an upper layer portion located above the lower layer portion, and at least part of light entering from the light emitting units is totally reflected on surfaces of the upper layer portions of the partition walls.

In the display device of the present disclosure, the lower layer portions of the partition walls are disposed in regions in which light emitted from a position at the farthest distance from the partition walls in light emitted from the light emitting units is not totally reflected, when all of the partition walls include the material forming the upper layer portions.

In the display device of the present disclosure including the preferred configuration described above, it is necessary to totally reflect light on the surfaces of the upper layer portions of the partition walls. Therefore, the upper layer portions of the partition walls preferably include a lowrefractive-index material having a refractive index of about 1.4 to 1.5, for example. The upper layer portions can include an inorganic oxide, for example. Particularly, the upper lower portions preferably include silicon oxide.

Note that the refractive index of the partition walls can be measured with an ellipsometer, for example. The similar applies to the refractive indexes of the organic layer and the filling layer.

In the display device of the present disclosure, the light emitting units may have a configuration of a top-emission type. The light emitting units include the organic layer that includes a hole transport layer, a light emitting layer, an electron transport layer, and the like and is interposed between the first electrodes and the second electrode. In a case where a cathode is shared, the second electrode serves as a cathode electrode, and the first electrodes serve as anode electrodes.

In the display device of the present disclosure including the preferred configuration described above, a material that hardly form leakage paths at the interfaces with the light emitting layers and is not restricted by the refractive index value can be selected as the material forming the lower layer portions of the partition walls. For example, when a material whose surface tends to have a negative potential comes into contact with the organic layer, holes are induced as carriers in the organic layer, causing leakage paths. Therefore, a material whose surface is less likely to have a negative potential is preferably selected as the material forming the lower layer portions of the partition walls. The lower layer portions can include an inorganic nitride or an inorganic oxynitride, for example. More specifically, the lower layer portions preferably include silicon nitride or silicon oxynitride.

Alternatively, the lower layer portions of the partition walls can include a resin material. More specifically, the lower layer portions can include polyimide resin or acrylic resin.

The display device of the present disclosure including the preferred configuration described above may have a so-called monochrome display configuration or a color display configuration. In the case of color display, the colors of light to be emitted from the light emitting units may be predetermined colors such as red, green, and blue. Alternatively, the color of light to be emitted from the light emitting units may be white, and color filters may be disposed above the light emitting units. A color filter can be formed using a resin material containing a pigment or a dye, for example.

In the case of a color display configuration, each one pixel may include a plurality of subpixels. Specifically, each one pixel may include the three subpixels of a red display subpixel, a green display subpixel, and a blue display subpixel. Further, each one pixel may include a set of subpixels further including one or more subpixels in addition to those three subpixels (such as a set of subpixels further including a white light emitting subpixel to increase luminance, a set of subpixels further including a complementary-color light emitting subpixel to expand the color reproduction range, a set of subpixels further including a yellow light emitting subpixel to expand the color reproduction range, or a set of subpixels further including yellow and cyan light emitting subpixels to expand the color reproduction range, for example).

Examples of values of pixels of the display device include some resolutions for image display, such as (1920, 1035), (720, 480), and (1280, 960), as well as VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536). However, the values of pixels are not limited to the above.

In the display device of the present disclosure including the preferred configuration described above, to further reduce the leakage paths at the interfaces with the light emitting layers, the upper layer portions of the partition walls each include a first upper layer portion on the lower layer portion side and a second upper layer portion above the first upper layer portion. The second upper layer portion may include the same material as the material forming the lower layer portions. In this case, the first upper layer portion may include a layer including the same material as the material forming the lower layer portions in the layer.

The partition walls can be formed using a material appropriately selected from among known inorganic materials and organic materials, and can be formed by a combination of a known film formation method such as physical vapor deposition (PVD) that is typically a vacuum deposition technique or a sputtering technique, or chemical vapor deposition (CVD) of any kind, and a known patterning technique such as an etching technique or a lift-off technique, for example. The filling layer filling the recesses between the partition walls can also be formed using a material appropriately selected from among known inorganic materials and organic materials.

In the display device according to the present disclosure, the configuration of the drive circuit or the like that controls light emission from the light emitting units is not limited to any particular configuration. For example, the light emitting units may be formed in a certain plane on the substrate, and may be disposed above the drive circuit that drives the light emitting units via an interlayer insulating layer, for example. The configuration of the transistors constituting the drive circuit is not limited to any particular one. The transistors may be p-channel field effect transistors, or may be n-channel field effect transistors.

The material forming the substrate may be a semiconductor material, a glass material, or a plastic material, for example. In a case where the drive circuit includes transistors formed on a semiconductor substrate, a well region is only required to be provided in a semiconductor substrate including silicon, for example, and transistors are only required to be formed in the well. In a case where the drive circuit includes thin-film transistors or the like, on the other hand, a thin semiconductor film is formed on a substrate including a glass material or a plastic material, to form the drive circuit. Various kinds of wiring lines may have conventional configurations and structures.

The first electrodes are disposed on the substrate for the respective light emitting units, and function as anode electrodes of the light emitting units. The first electrodes may include a metal such as Cr, Au, Pt, Ni, Cu, Mo, W, Ti, Ta, Al, Fe, or Ag, or an alloy of these metals or the like, or may include a stack of a plurality of films including these metals, for example. In some cases, the first electrodes may be formed as transparent electrodes with a transparent conductive material such as indium zinc oxide or indium tin oxide. In such a case, a light reflecting layer including a metal or an alloy may be provided between the substrate and the first electrodes.

The organic layer contains an organic light emitting material, and is provided as a shared continuous film on the first electrodes and the partition walls. The organic layer emits light when a voltage is applied between the first electrodes and the second electrode. The organic layer can include a structure in which a hole injection layer, a hole transport layer, a light emitting layer, an electron transport layer, and an electron injection layer are sequentially stacked in this order from the first electrode side, for example. The hole transport material, the hole transport material, the electron transport material, and the organic light emitting material constituting the organic layer are not limited to any particular materials, and known materials can be used.

Note that the organic layer may have a so-called tandem structure in which a plurality of light emitting layers is connected via a charge generation layer or intermediate electrodes. For example, it is possible to form a light emitting unit that emits white light by stacking a light emitting layer that emits red light, a light emitting layer that emits green light, and a light emitting layer that emits blue light.

The second electrode is provided as a shared continuous film on the organic layer. The second electrode can be formed using a material having a high light transparency. For example, the second electrode can be formed using a transparent conductive material such as indium tin oxide, indium zinc oxide, zinc oxide, aluminum-doped zinc oxide, or gallium-doped zinc oxide. Alternatively, the second electrode can be formed using a metal, an alloy, or the like, and be made so thin as to have light transparency.

The filling layer is formed on the second electrode, and prevents moisture and oxygen from entering the organic layer. The filling layer can be formed using a material having a high light transparency and a low water permeability. For example, the filling layer can include silicon oxide ($SiO_x$), aluminum oxide ($AlO_x$), a resin material such as epoxy resin and acrylic resin, or a combination of these materials.

The conditions shown in each expressions in this specification are satisfied not only in a case where the expression is true in strict mathematical terms, but also in a case where the expression is substantially true. For an expression to be true, variations are allowed to exist in designing or manufacturing display elements, display panels, and the like. Further, the drawings to be used in the description below are schematic drawings. For example, FIG. 2, which will be described later, shows a cross-sectional structure of a display device, but does not indicate the ratios of width, height, thickness, and the like.

First Embodiment

A first embodiment relates to a display device and an electronic apparatus according to a first aspect of the present disclosure.

FIG. 1 is a schematic plan view of a display device according to the first embodiment of the present disclosure. A display device 1 is an active matrix color display device, and is a display device that displays an image or the like by controlling light emission from each light emitting unit in a plurality of light emitting units arranged on a plane. The plurality of light emitting units arranged on a plane each forms a subpixel 10 for red-color display, green-color display, or blue-color display, for example, and three of those subpixels 10 constitute one pixel.

As shown in the drawing, the subpixels 10 are arranged in delta arrangement. The size of one pixel surrounded by dashed lines is a size of five micrometers×five micrometers, for example. Note that, in FIG. 1, the red display subpixels are represented by "R", the green display subpixels are represented by "G", and the blue display subpixels are represented by "B".

The planar shape of the subpixels 10 or the light emitting units 150 shown in FIG. 2, which will be described later, is a round shape. Note that the arrangement of the subpixels 10 is not necessarily delta arrangement. For example, the arrangement of the subpixels 10 may be so-called striped arrangement.

In the display device according to the present embodiment, the configurations of the drive circuit that controls the light emission from the subpixels 10, the power supply circuit that supplies power to the subpixels 10, or the like are not limited to any particular configurations. Therefore, illustrations and detailed explanations regarding these configurations are provided herein.

Figure 2:
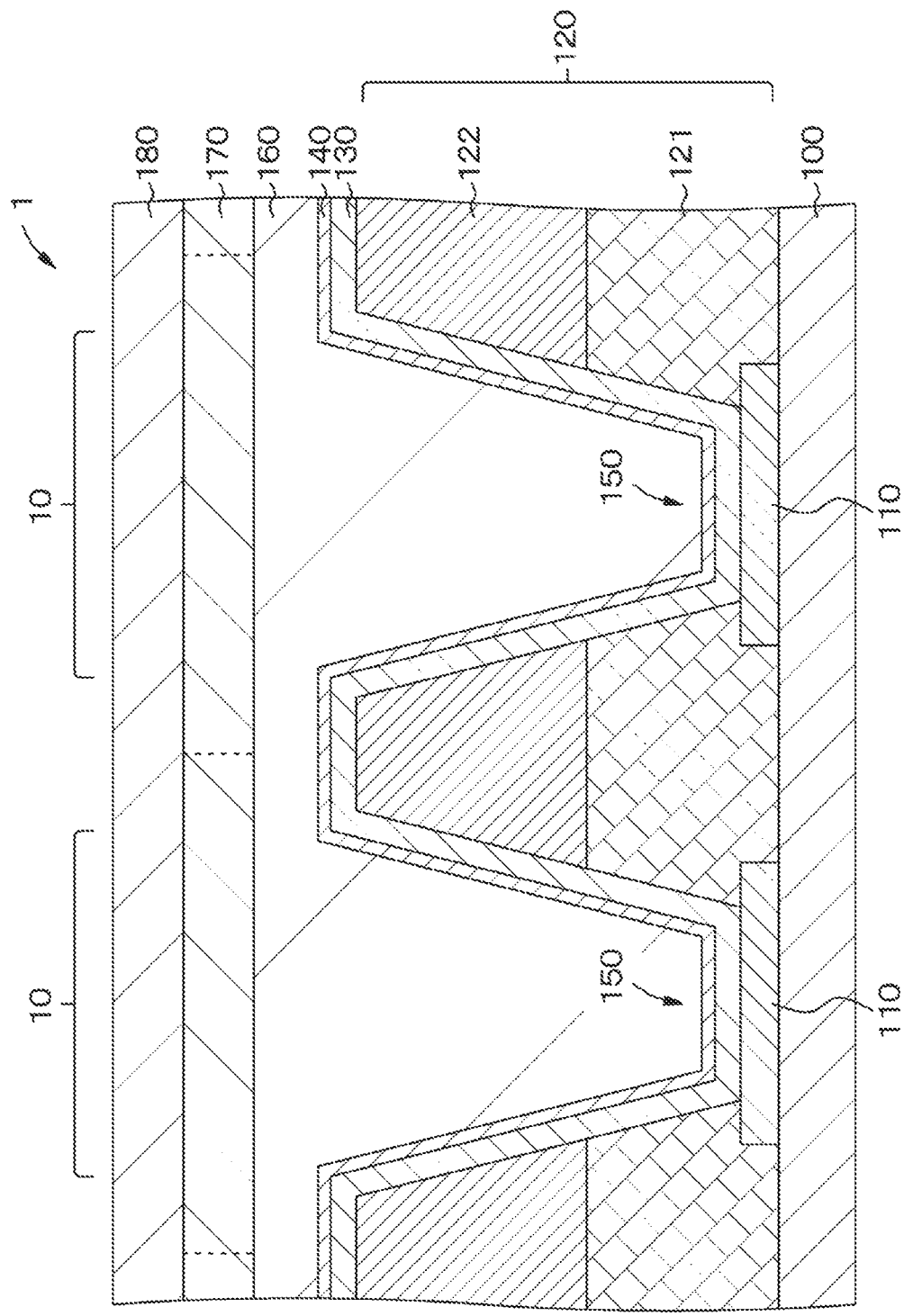
FIG. 2 is a schematic partial cross-sectional view of the display device according to the first embodiment.

FIG. 2 is a schematic partial cross-sectional view of the display device according to the first embodiment.

In the display device 1, light emitting units 150 each formed by stacking a first electrode 110, an organic layer 130, and a second electrode 140 are formed on a substrate 100, and are arranged in a two-dimensional matrix.

The substrate 100 is a support that supports a plurality of the light emitting units 150 arranged on one surface thereof. Although not shown, the substrate 100 includes the drive circuit for controlling the light emission from the subpixels 10 (more specifically, the light emission from the light emitting units 150), the power supply circuit for supplying power to the subpixels 10, scan lines, data lines, and the like. The substrate 100 includes a semiconductor material with which it is easy to form a transistor or the like.

The first electrode 110 includes an aluminum copper alloy (AlCu), for example, and is provided for each light emitting unit 150, for example. Partition walls 120 are formed between adjacent first electrodes 110. As will be described later in detail, each partition wall 120 includes a stack of two or more layers.

The first electrodes 110 functions as anode electrodes of the light emitting units 150. The partition walls 120 are disposed between the adjacent first electrodes 110, and separate the light emitting units 150 from one another. If the side surfaces of the first electrodes 110 are exposed, the thickness of the organic layer 130 to be formed on the first electrode 110 tends to be thin, which will cause abnormal light emission. Therefore, the partition walls 120 are formed to cover the side surfaces of the first electrodes 110. The cross-sectional shape of the partition walls 120 is a substantially trapezoidal shape (a tapered shape) having inclined surfaces. The partition walls 120 are formed by forming substantially circular openings in the material layer of the partition walls 120, with the side of the first electrodes 110 being the bottom side, the opposite side from the bottom side being open.

The organic layer 130 and the second electrode 140 are stacked on the entire surface including a part over the first electrodes 110 and a part over the partition walls 120. The light emitting units 150 include the organic layer 130 that includes a hole transport layer, a light emitting layer, an electron transport layer, and the like and is interposed between the first electrodes 110 and the second electrode 140.

The organic layer 130 has a multilayer structure, but is shown as a single layer in the drawing. The organic layer 130 has a tandem structure in which a red light emitting layer, a green light emitting layer, a blue light emitting layer, and the like are stacked, and emits white light.

A filling layer 160 that fills the recesses between the partition walls 120 is formed on the second electrode 140. The display device 1 includes color filters disposed above the light emitting units 150. Specifically, color filters 170 corresponding to the display colors are disposed on the filling layer 160, and a transparent substrate 180 is disposed thereon. The subpixels 10 include the above described stack structures.

Note that, to improve contrast, a light blocking layer forming a so-called black matrix may be provided, for example. The blocking layer may be formed using a material such as chromium (Cr) or graphite, for example. The blocking layer may be formed in the same layer as the color filters 170, or may be formed in a different layer from the color filters 170.

The partition walls 120 each include a stack of two or more layers including a lower layer portion 121 located on the side of the light emitting unit 150 and an upper layer portion 122 located above the lower layer portion 121. The upper layer portion 122 includes an inorganic oxide. More specifically, the upper layer portion 122 includes silicon oxide ($SiO_x$).

The lower layer portion 121 can be formed using an inorganic nitride, an inorganic oxynitride, or a resin material. The lower layer portion 121 explained in this description includes silicon nitride ($SiN_x$).

As for the refractive indexes of the respective components, the refractive indexes of the organic layer 130, the filling layer 160, and the lower layer portions 121 of the partition walls 120 are about 1.8, for example, and the refractive index of the upper layer portions 122 of the partition walls 120 is about 1.4, for example. As will be described later in detail with reference to FIG. 7, at least part of light entering from the light emitting units 150 is totally reflected by the surfaces of the upper layer portions 122 of the partition walls 120. The display device according to this embodiment is a top-emission display device that extracts light emitted from the light emitting units 150, from the side of the filling layer 160.

Here, to facilitate understanding of the present disclosure, the problem of a display device of a reference example having a configuration in which the partition walls are formed only with silicon oxide ($SiO_x$) is described.

Figure 3:
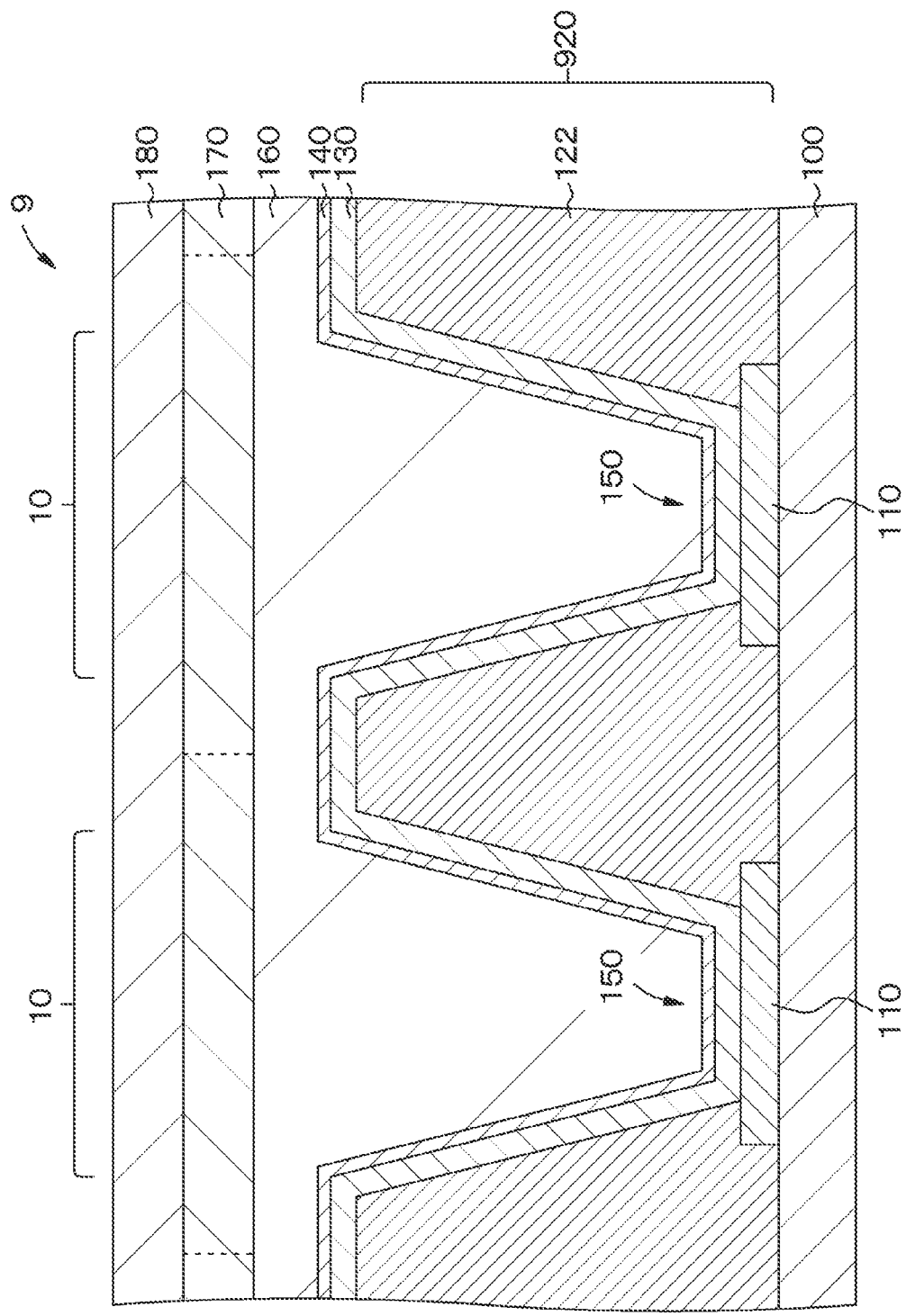
FIG. 3 is a schematic partial cross-sectional view of a display device according to a reference example.
Figure 4:
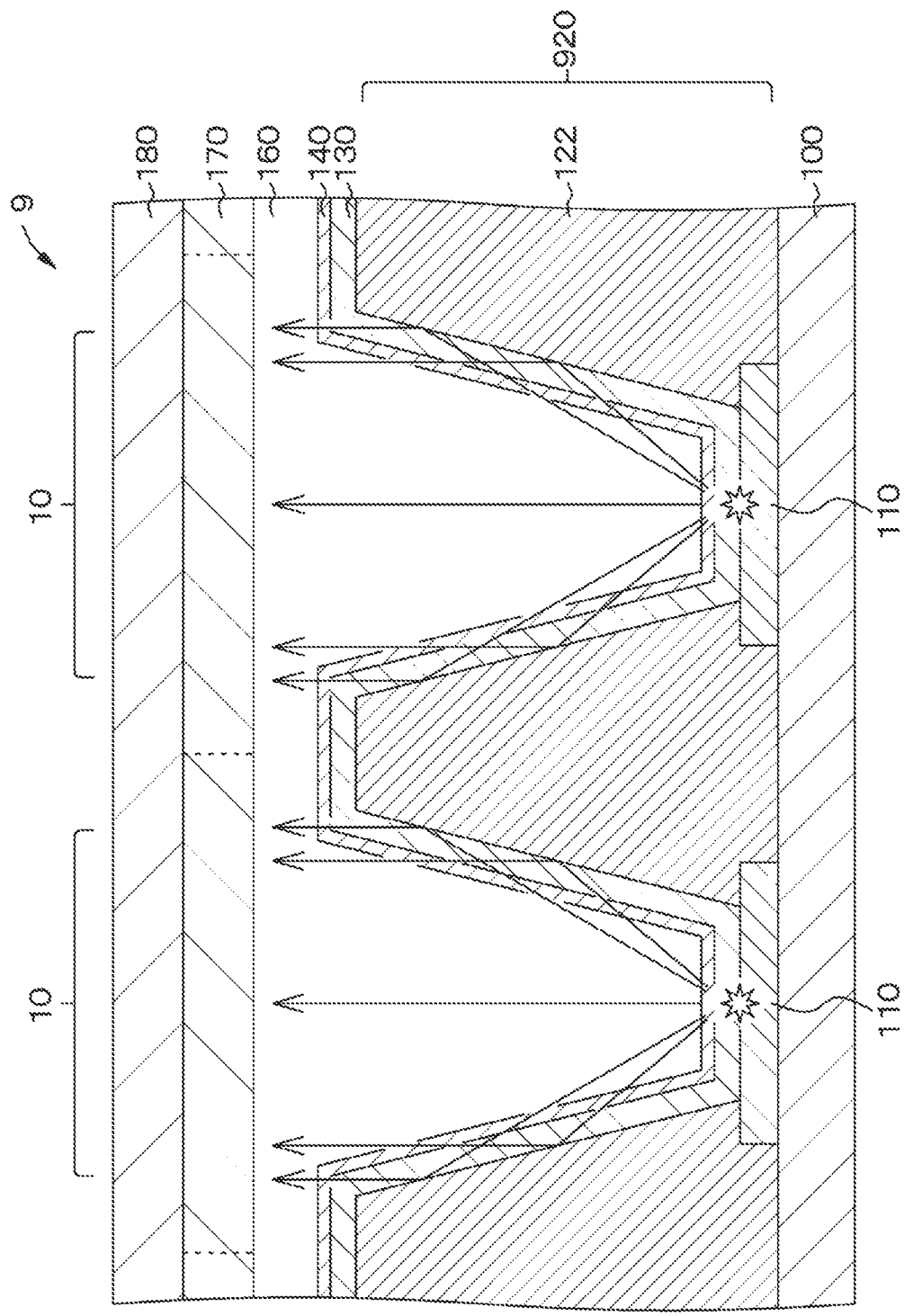
FIG. 4 is a schematic partial cross-sectional view for explaining light reflection in the display device according to the reference example.
Figure 5:
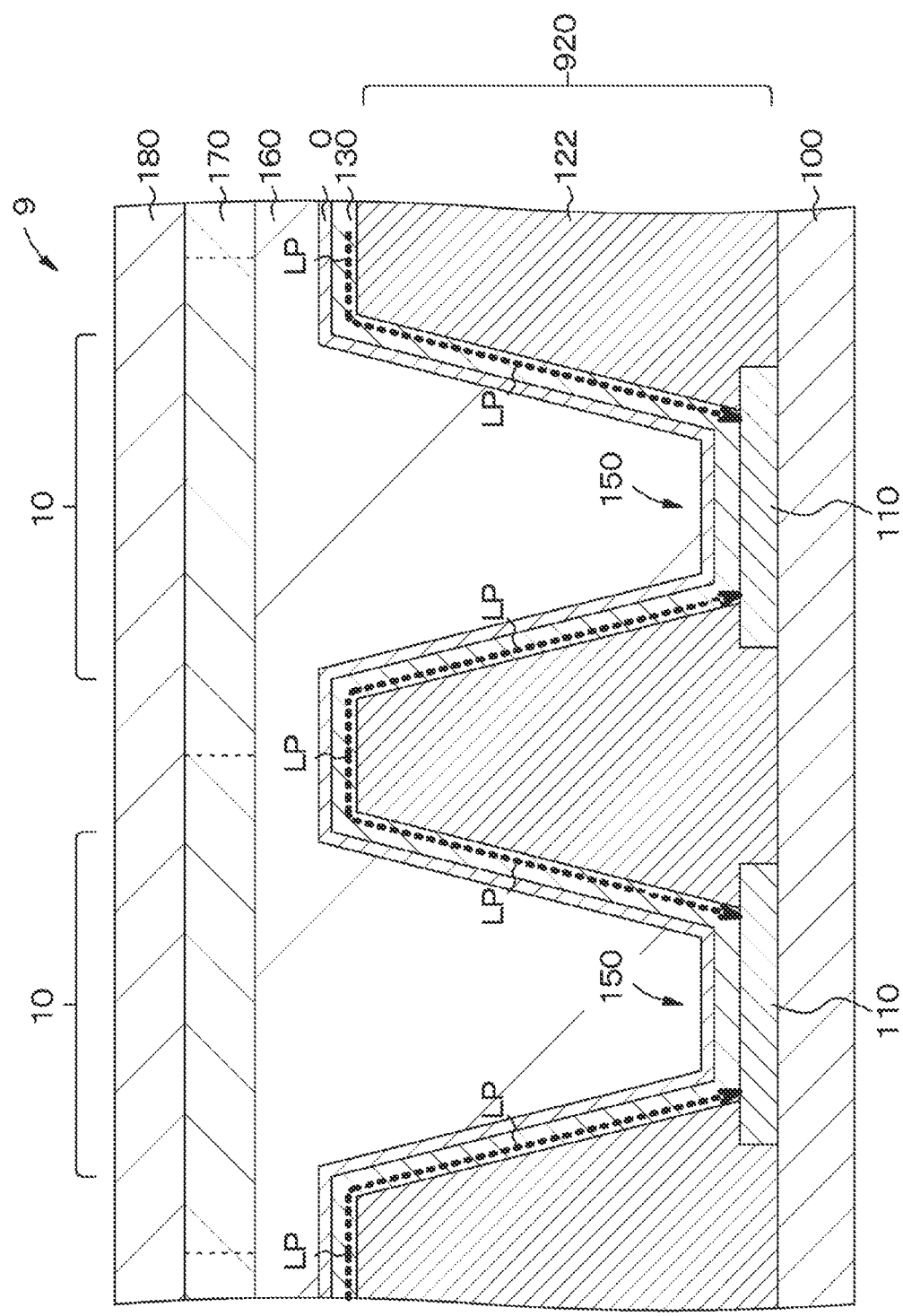
FIG. 5 is a schematic partial cross-sectional view for explaining leakage paths between first electrodes in the display device according to the reference example.

FIG. 3 is a schematic partial cross-sectional view of a display device according to a reference example. FIG. 4 is a schematic partial cross-sectional view for explaining light reflection in the display device according to the reference example. FIG. 5 is a schematic partial cross-sectional view for explaining leakage paths between first electrodes in the display device according to the reference example.

A display device 9 of the reference example shown in FIG. 3 differs from the display device 1 shown in FIG. 1 in having a configuration in which the entire partition walls include silicon oxide ($SiO_x$), for example. In this case, the refractive index of the partition walls 920 is a constant value of 1.4, for example, regardless of whether the refractive index is of the upper layer portion or of the lower layer portion. Further, as described above, the refractive index of the organic layer 130 and the filling layer 160 is about 1.8, for example. Therefore, as shown in FIG. 4, of light emitted from the light emitting units 150, the light that enters the partition walls 920 beyond the critical angle is totally reflected by the surfaces of the partition walls 920. Accordingly, the light extraction efficiency becomes higher.

However, when silicon oxide ($SiO_x$) and an organic layer are formed in contact with each other, for example, carriers are sometimes induced in the organic layer. Therefore, in a configuration like that of the display device 9 of the reference example, it is conceivable that leakage paths are formed at the portions at which the partition walls 920 are in contact with the organic layer 130. In FIG. 5, the leakage paths (denoted by LP) are indicated by heavy dashed lines.

In this case, there is a possibility that unexpected short-circuiting will occur due to a leakage path LP between adjacent first electrodes 110, which will cause a decrease in reliability.

The problem of the display device 9 of the reference example is as described above.

In view of the above problem, in the display device 1 according to the first embodiment, the partition walls 120 each include a stack of two or more layers including the lower layer portion 121 on the side of the light emitting unit 150 and the upper layer portion 122 located above the lower layer portion 121.

Figure 6:
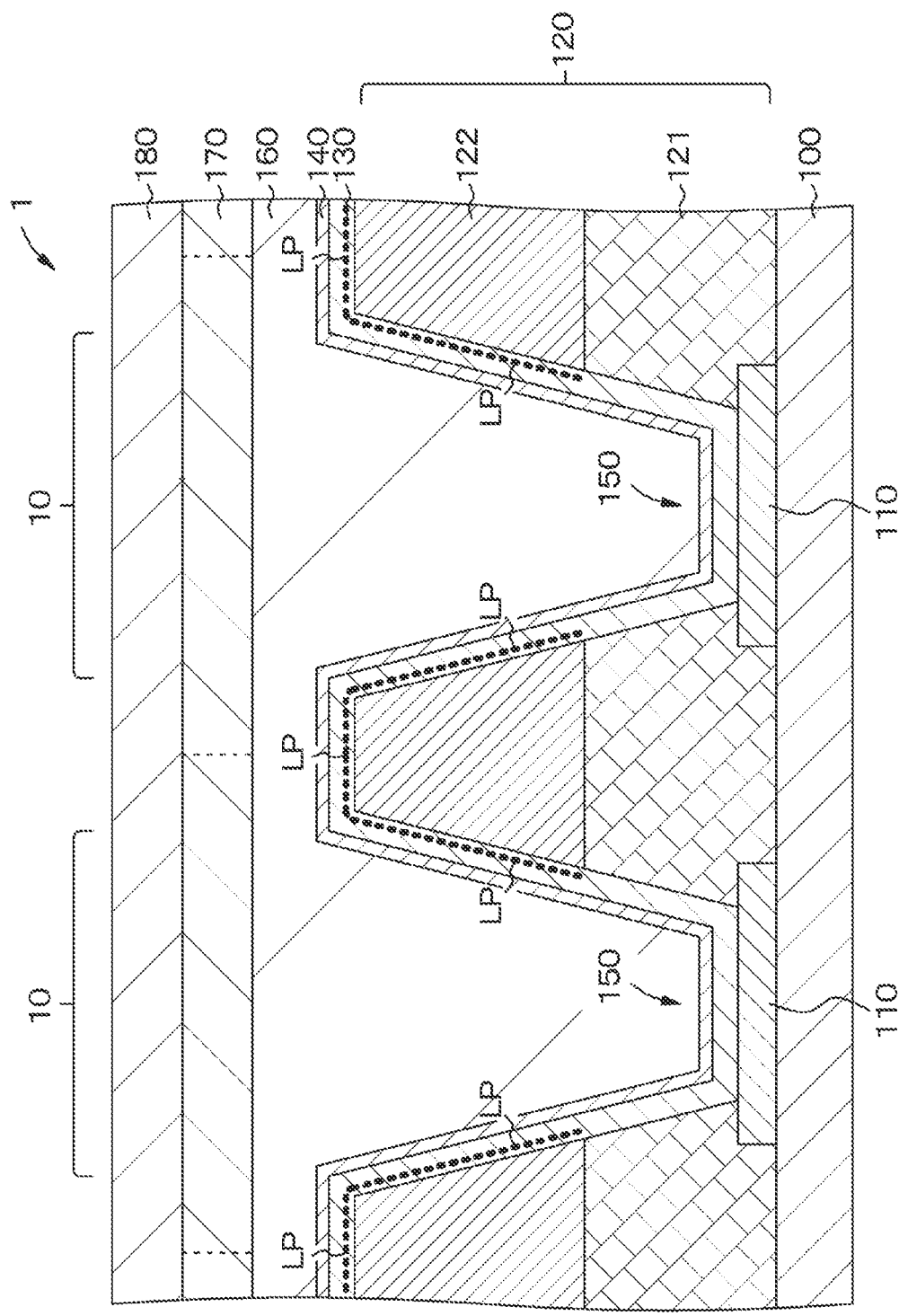
FIG. 6 is a schematic partial cross-sectional view for explaining that leakage paths between the first electrodes in the display device according to first embodiment are divided from one another.

FIG. 6 is a schematic partial cross-sectional view for explaining that leakage paths between the first electrodes in the display device according to the first embodiment are divided from one another.

A comparison between a case where silicon nitride ($SiN_x$) is in contact with an organic layer and a case where silicon oxide ($SiO_x$) is in contact with an organic layer shows that leakage paths are less likely to be formed in the former case. Therefore, as shown in FIG. 6, in the display device 1, the leakage paths LP are restricted mainly to the portions at which the organic layer 130 is in contact with the upper layer portions 122 of the partition walls 120, and thus, the leakage paths between the first electrodes 110 can be divided from one another.

Figure 7:
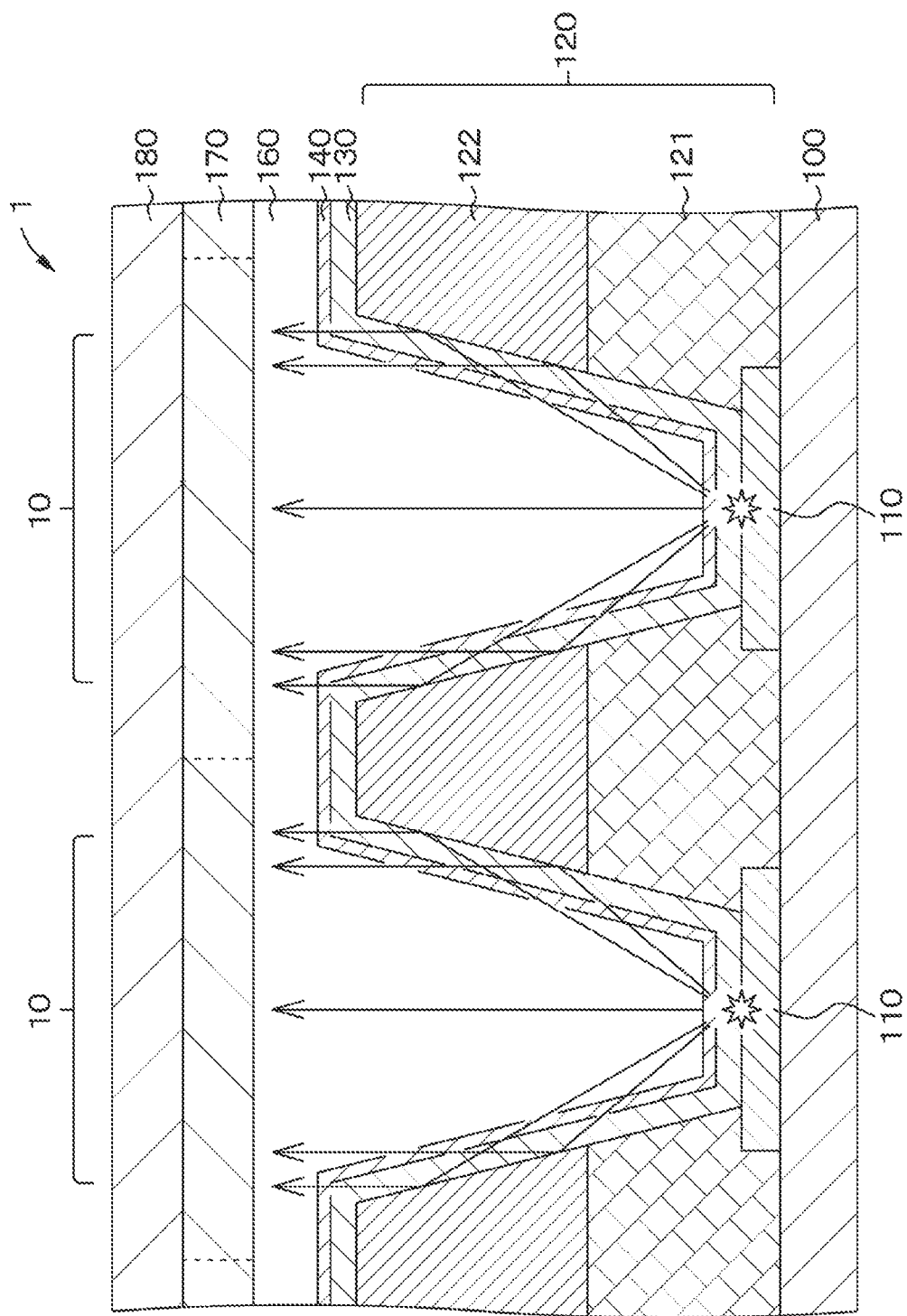
FIG. 7 is a schematic partial cross-sectional view for explaining light reflection in the display device according to the first embodiment.

In a case where the lower layer portions 121 of the partition walls 120 include silicon nitride ($SiN_x$) or the like, the refractive index of the lower layer portions 121 is substantially similar to the refractive index of the organic layer 130 and the filling layer 160. Therefore, light reflection at the partition walls 120 occurs mainly on the surfaces of the upper layer portions 122. FIG. 7 is a schematic partial cross-sectional view for explaining light reflection in the display device according to the first embodiment.

The thicker the lower layer portions 121 of the partition walls 120, the higher the effect to divide the leakage paths from one another. However, if the lower layer portions 121 are made thicker than necessary, the light extraction efficiency depending on total reflection would become lower. Therefore, it is preferable to take the light extraction efficiency into consideration in setting the thickness of the lower layer portions 121 of the partition walls 120.

In the first embodiment, the lower layer portions 121 of the partition walls 120 are disposed in the regions in which light emitted from a position at the farthest distance from the partition walls 120 (this light will be hereinafter referred to simply as the farthest light in some cases) of light emitted from the light emitting units 150 is not totally reflected in a case where all the partition walls include the material forming the upper layer portions. This aspect will be described below, with reference to a drawing.

Figure 8:
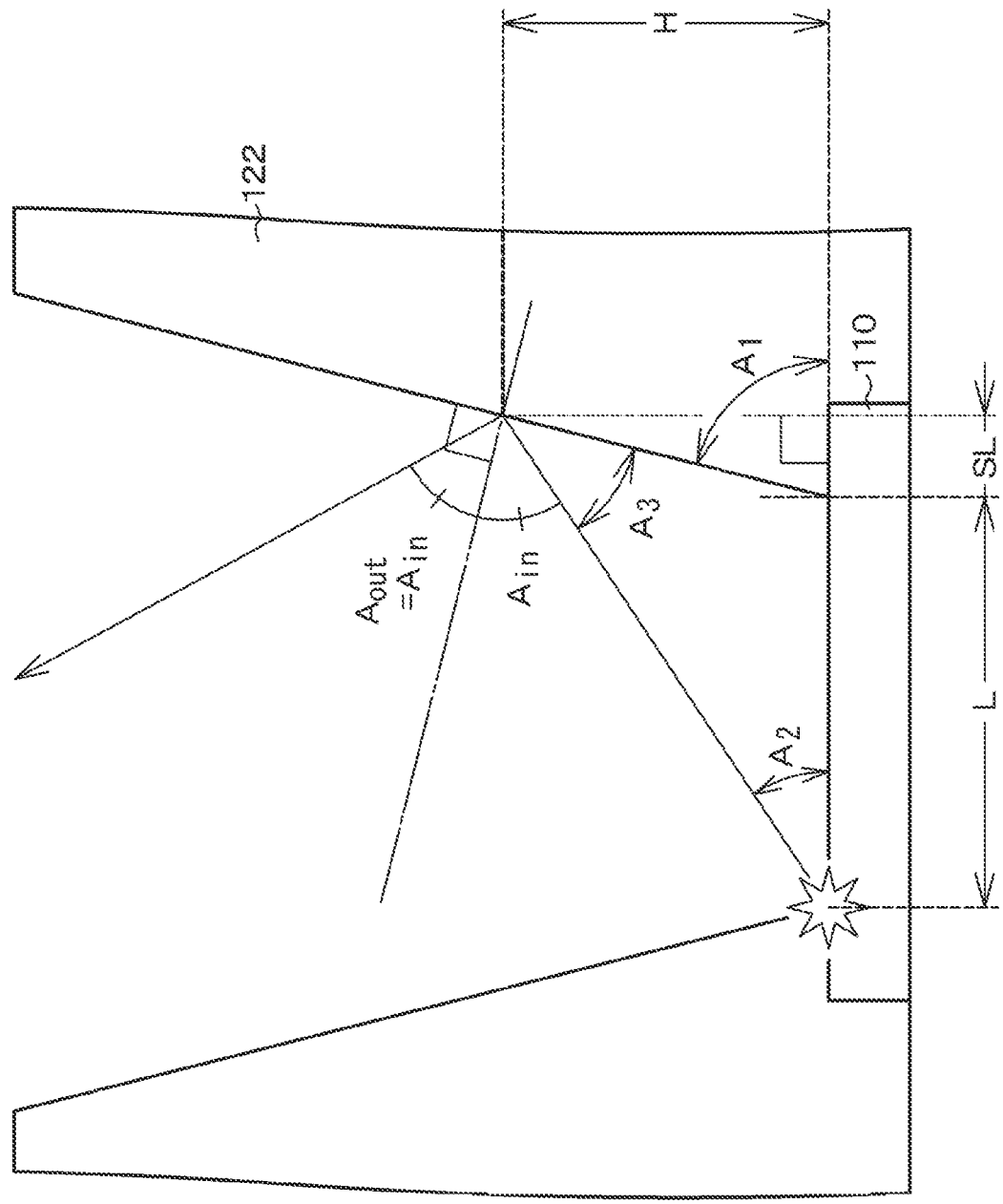
FIG. 8 is a schematic diagram for explaining the conditions for total reflection on a partition wall.

FIG. 8 is a schematic diagram for explaining the conditions for total reflection on a partition wall. In the description below, it is assumed that all the partition walls include the material forming the upper layer portions. For example, the refractive index of the partition walls is a value of 1.4, regardless of the location. Further, the refractive index of the filling layer and the organic layer is a value of 1.8.

In FIG. 8, the following are defined.

Symbol L: the diameter (the width) of the bottom of a partition opening

Symbol H: the height of a partition wall the farthest light enters

Symbol $A_{in}$: the incident angle (unit: degree) between the farthest light and an inclined surface of the partition wall Symbol $A_1$: the angle (unit: degree) between the bottom surface of the partition opening and the inclined surface of the partition wall Further, symbols $A_2$ and $A_3$ represent internal angles (unit: degree) of the triangle shown in FIG. 8.

In this case, $$SL=H/\tan(A_1) \quad \text{(Equation 1)}$$

$$A_2=\tan^{-1}(H/(L+SL)) \quad \text{(Equation 2)}$$

Further, from the relationship of the sum of the external angles of a triangle, the following is established:

$$A_2+A_3=A_1 \quad \text{(Equation 3)}$$

Then, since $A_3=90-A_{in}$, (Equation 4), the following is obtained according to (Equation 3) and (Equation 4):

$$A_2=A_{in}+A_1-90 \quad \text{(Equation 5)}$$

Here, $$\tan(A_2)=H/(L+SL) \quad \text{(Equation 6)}$$

Therefore, the following is obtained according to (Equation 6) and (Equation 1):

$$H = (L + SL) \times \tan(A_2) = (L + H/\tan(A_1)) \times \tan(A_2) \quad \text{(Equation 7)}$$

Where (Equation 7) is further arranged with respect to H, the following is obtained:

$$H=L \times \tan(A_2)/(1-\tan(A_2)/\tan(A_1)) \quad \text{(Equation 8)}$$

Further, where (Equation 5) is substituted into (Equation 8), the following is obtained:

$$H=L \times \tan(A_{in}+A_1-90)/(1-\tan(A_{in}+A_1-90)/\tan(A_1)) \quad \text{(Equation 9)}$$

Here, the critical angle on the surface of the partition wall is represented by symbol $A_{CA}$. Where the height of the partition wall at a time when the farthest light enters the surface of the partition wall at the critical angle $A_{CA}$ is represented by symbol $H_{CA}$, the value of the height is expressed as follows on the basis of (Equation 9):

$$H_{CA}=L \times \tan(A_{CA}+A_1-90)/(1-\tan(A_{CA}+A_1-90)/\tan(A_1)) \quad \text{(Equation 10)}$$

Total reflection of light occurs in a region in which the incident angle is equal to or greater than the critical angle.

Therefore, in a region in which $$H \geq H_{CA},$$

the farthest light enters at an angle equal to or greater than the critical angle, and is totally reflected In a region in which $$H < H_{CA},$$

on the other hand, the farthest light enters at a smaller angle than the critical angle, and is not totally reflected.

As described above, in a region in which $$H < H_{CA},$$

the farthest light is not totally reflected. In other words, the regions in which $H<H_{CA}$ on the partition walls do not affect the farthest light extraction efficiency. In view of the above, the lower layer portions of the partition walls can be designed to be disposed in the regions in which $H<H_{CA}$ in the first embodiment. FIG. 9 is a schematic diagram for explaining a partition structure in the display device according to the first embodiment.

As the lower layer portions are disposed in the regions in which $H<H_{CA}$, it is possible to prevent a decrease in light extraction efficiency due to total reflection while dividing the leakage paths from one another.

Next, the appropriate value of $H_{CA}$ is described with a numerical example.

Where the refractive index of the partition walls is 1.4, and the refractive index of the filling layer is 1.8, the critical angle $A_{CA}$ is calculated as follows according to Snell's law:

$$A_{CA}=\sin^{-1}(1.4/1.8)$$

$\approx 51.3$ (degrees) Further, where symbol L=1000 (nanometer), and symbol $A_1=71$ (degrees)

a value of about 500 (nanometers) is obtained for $H_{CA}$, on the basis of (Equation 10). Therefore, in the case of the above numerical example, partition walls in which the thickness of each lower layer portion is set to a smaller value than about 500 (nanometers) are only required to be used.

Next, a method of manufacturing the display device 1 according to the first embodiment of the present disclosure is described.

FIGS. 10 through 17 are schematic partial end views for explaining the method of manufacturing the display device according to the first embodiment.

Figure 10A:
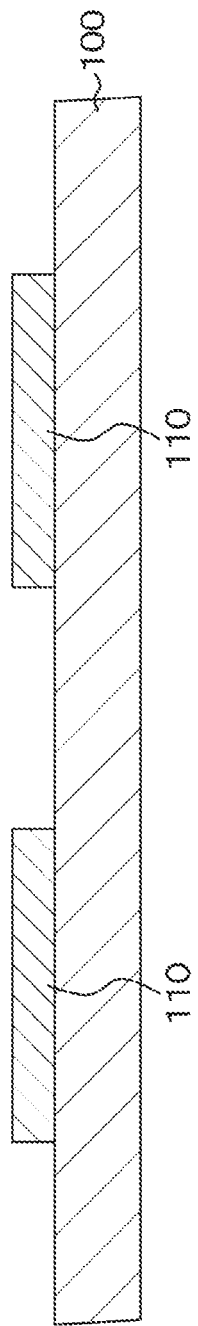
FIGS. 10A and 10B are schematic partial end views for explaining a method of manufacturing the display device according to the first embodiment.

[Step 100] (see FIG. 10A)

First, the first electrodes 110 are formed on the substrate 100. Specifically, the substrate 100 is prepared, and a material layer including an aluminum copper alloy (AlCu) is formed thereon. The portions corresponding to the first electrodes 110 are then covered with a mask, and etching is performed, to form the first electrodes 110.

Figure 10B:
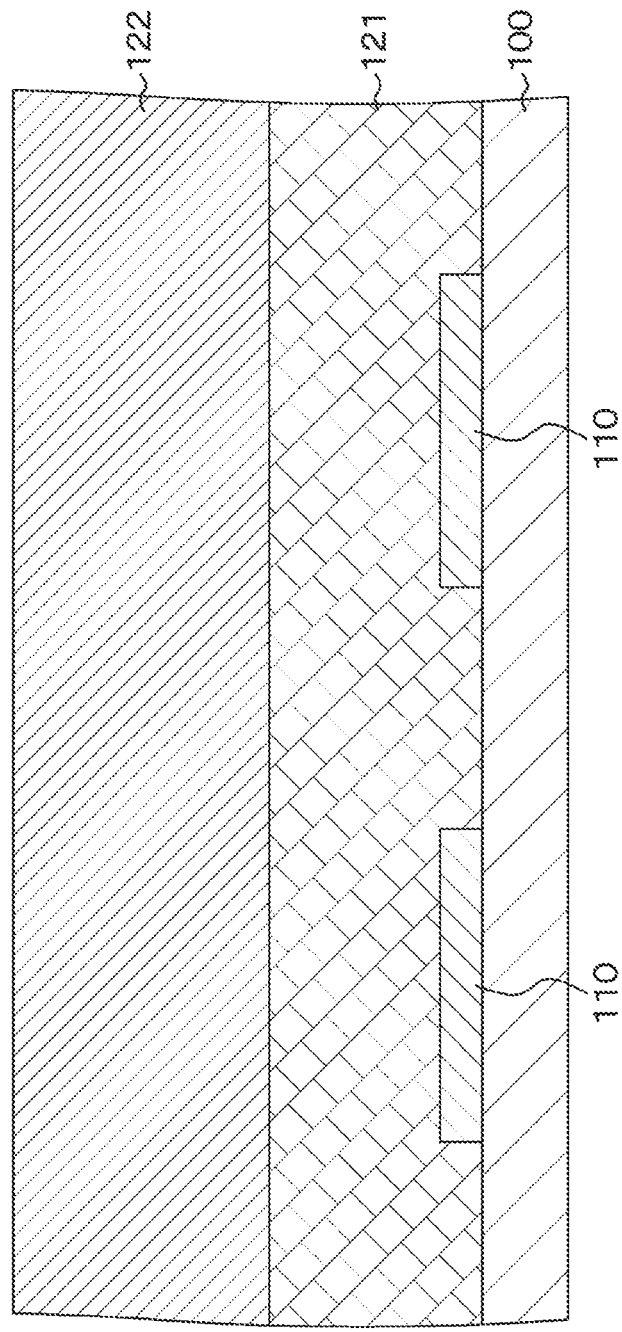

[Step 110] (see FIG. 10B)

After that, a material layer for forming the partition walls 120 is formed. A material layer 121 that corresponds to the lower layer portions of the partition walls 120 and includes silicon nitride ($SiN_x$) is formed on the entire surface of the substrate 100 as well as on the first electrodes 110. A material layer 122 that corresponds to the upper layer portions of the partition walls 120 and includes silicon oxide ($SiO_x$) is then formed on the material layer 121.

[Step 120] (see FIGS. 11, 12, 13, and 14)

Figure 11:
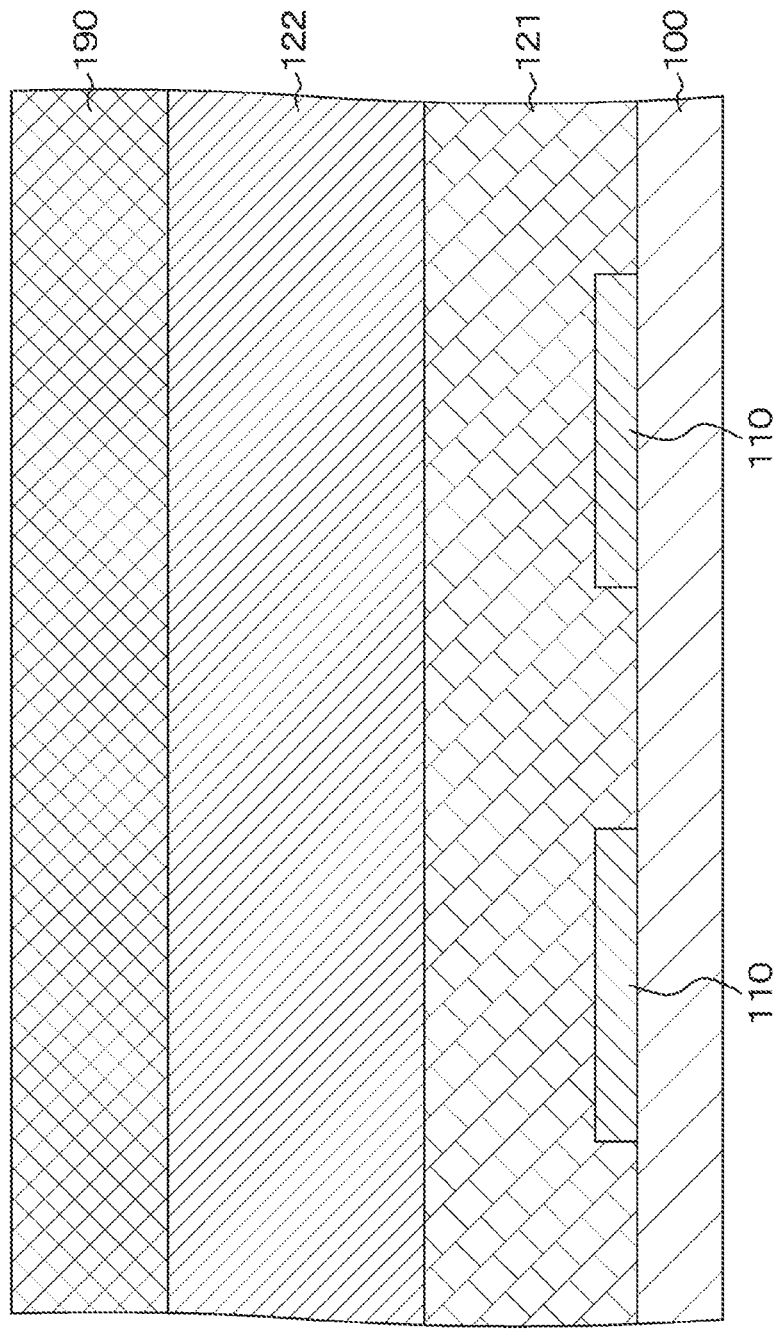
FIG. 11 is a schematic partial end view for explaining, continuing from FIG. 10B, the method of manufacturing the display device according to the first embodiment.
Figure 12:
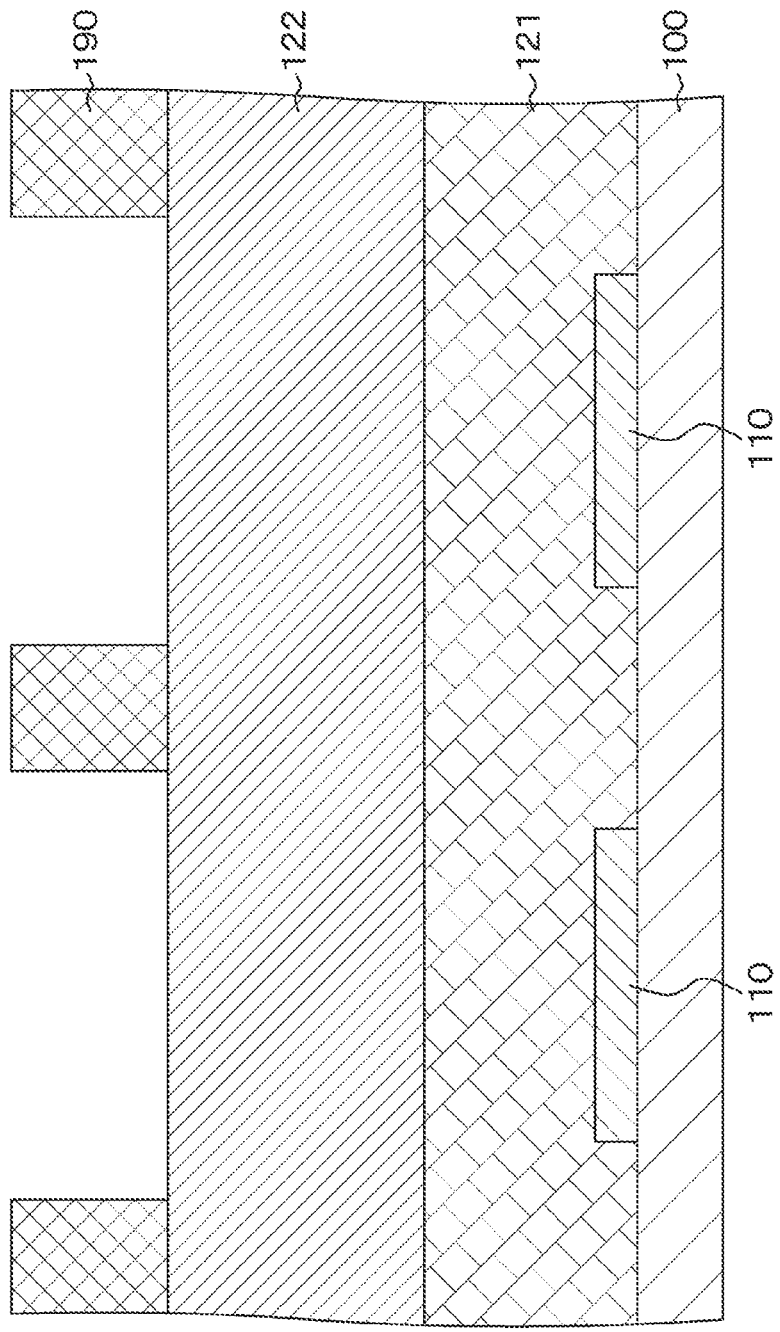
FIG. 12 is a schematic partial end view for explaining, continuing from FIG. 11, the method of manufacturing the display device according to the first embodiment.
Figure 13:
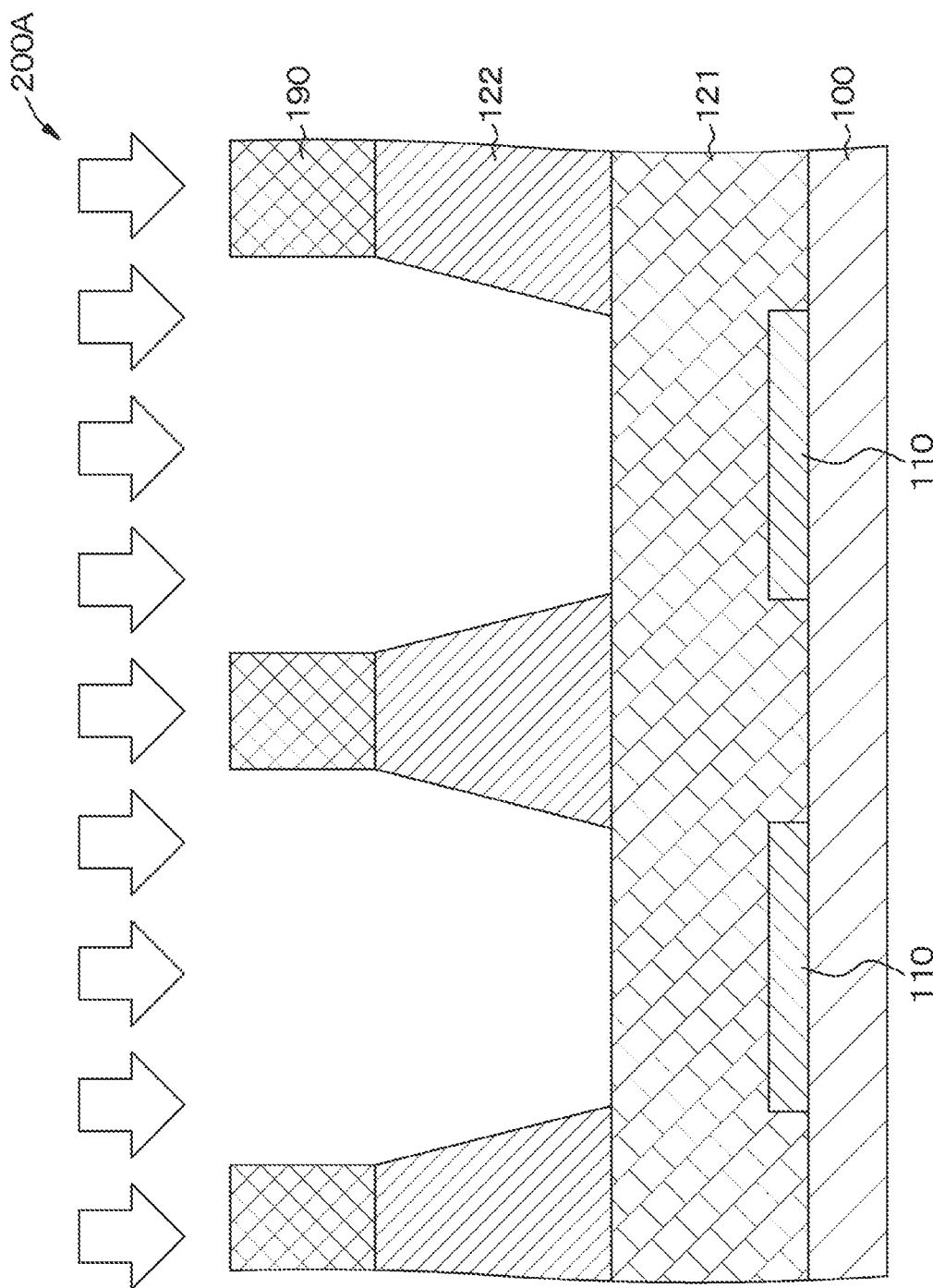
FIG. 13 is a schematic partial end view for explaining, continuing from FIG. 12, the method of manufacturing the display device according to the first embodiment.
Figure 14:
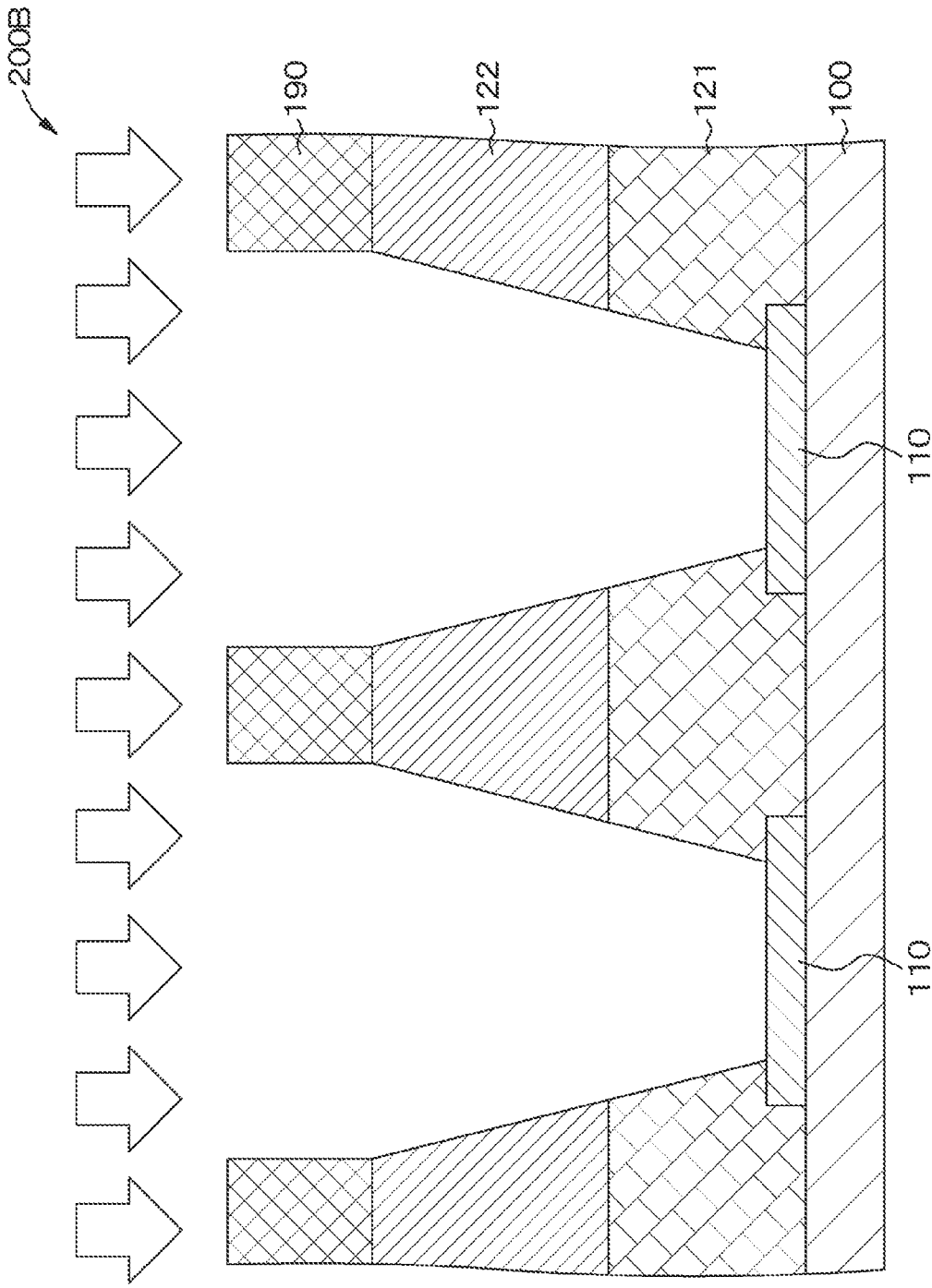
FIG. 14 is a schematic partial end view for explaining, continuing from FIG. 13, the method of manufacturing the display device according to the first embodiment.

After that, the partition walls 120 are formed. First, a resist material layer 190 for forming a mask portion is formed on the entire surface of the material layer 122 (FIG. 11). Patterning is then performed on the material layer 190 by a lithography technique, to form a mask portion 190 for forming the partition walls 120 (FIG. 12).

After that, etching is performed. First, a first etching process (indicated by reference numeral 200A) suitable for the material layer 122 is performed. For example, plasma etching is performed in an atmosphere in which an oxygen gas is added to a fluorocarbon-based gas ($C_xF_y$). In a case where plasma etching is performed, it is possible to detect the end of an etching process for the material layer 122 by detecting a changing state of plasma emission (see FIG. 13). A second etching process (indicated by reference numeral 200B) suitable for the material layer 121 is then performed. When the end of the etching process for the material layer 121 is detected, the etching is ended (see FIG. 14). At the same time, the mask portion 190 is removed (not shown). Note that, in some cases, the first etching process and the second etching process can be performed under the same conditions. In that case, it is not necessary to detect the end of either etching process.

Figure 15:
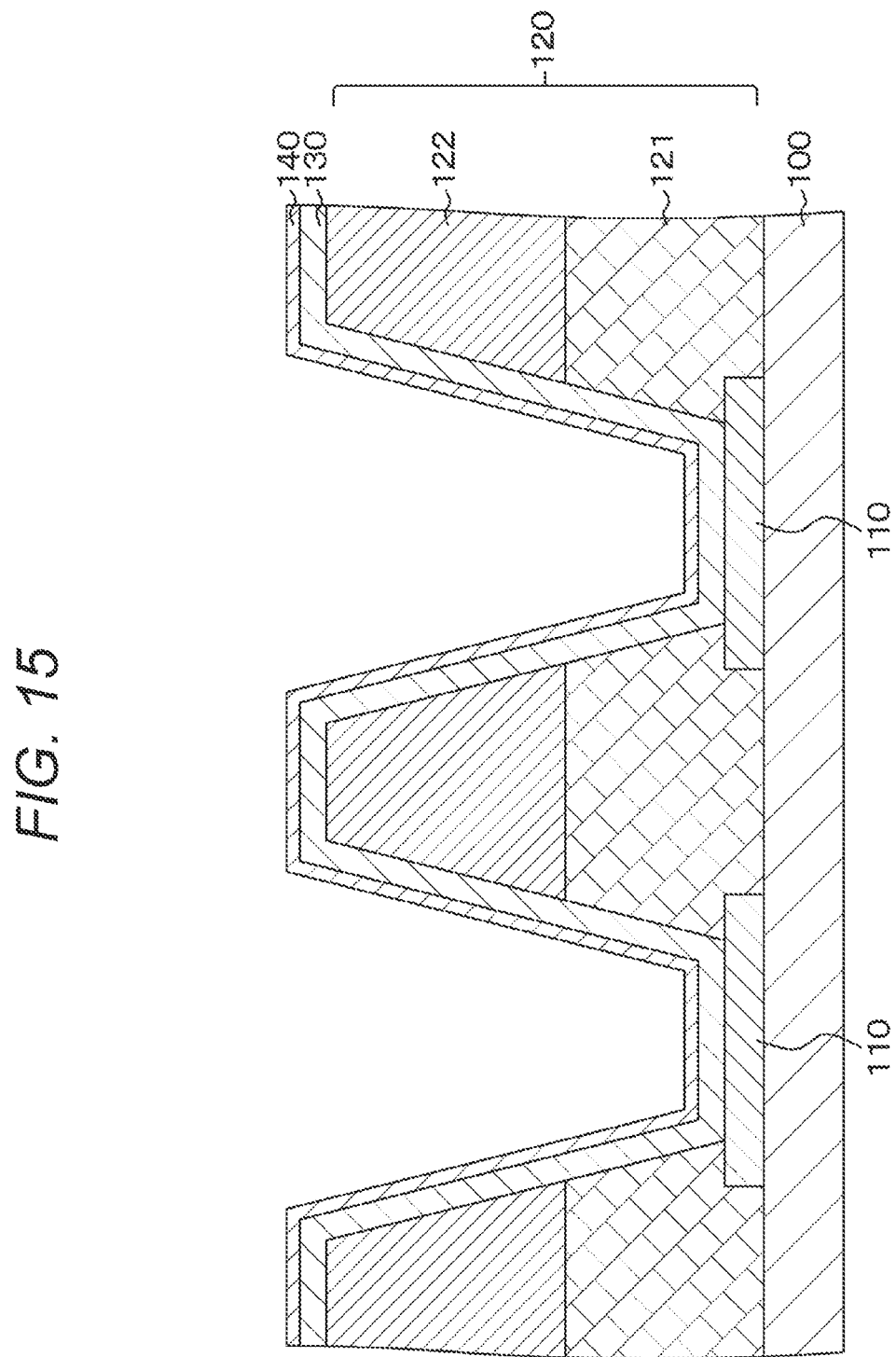
FIG. 15 is a schematic partial end view for explaining, continuing from FIG. 14, the method of manufacturing the display device according to the first embodiment.

[Step 130] (see FIG. 15)

The organic layer 130 and the second electrode 140 are then sequentially formed on the first electrodes 110 and the entire surfaces of the partition walls 120 including the wall surfaces and the top surfaces thereof.

Figure 16:
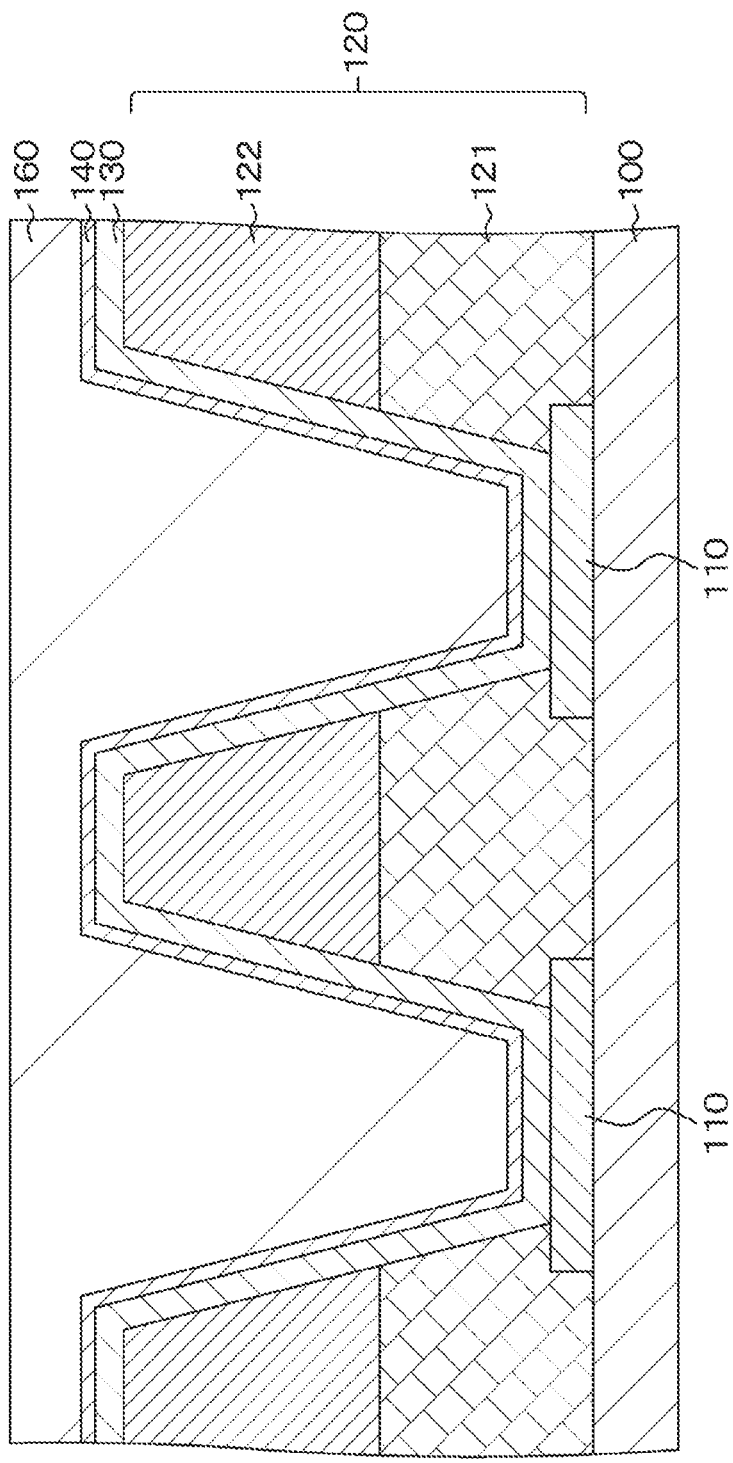
FIG. 16 is a schematic partial end view for explaining, continuing from FIG. 15, the method of manufacturing the display device according to the first embodiment.
Figure 17:
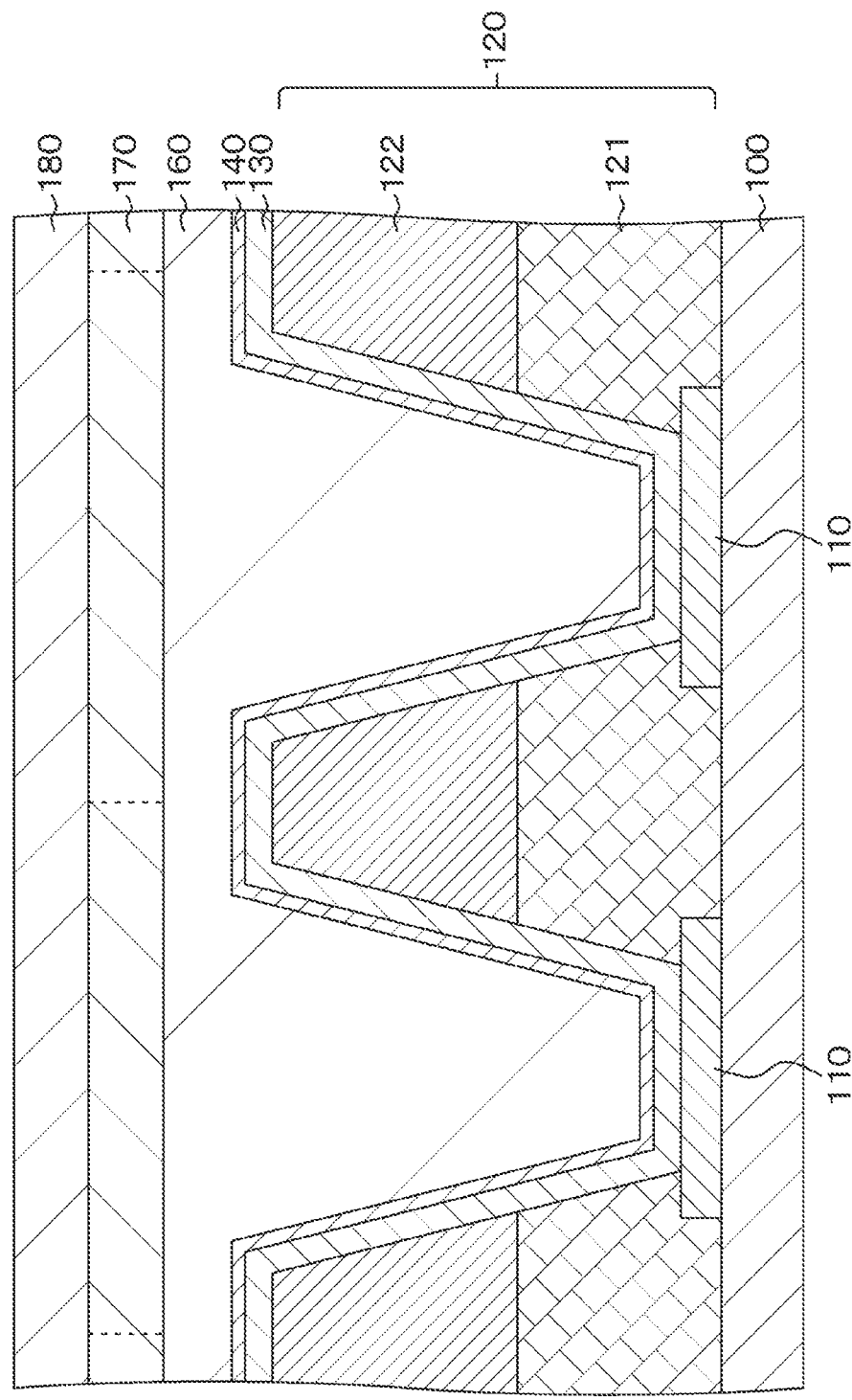
FIG. 17 is a schematic partial end view for explaining, continuing from FIG. 16, the method of manufacturing the display device according to the first embodiment.

[Step 140] (see FIGS. 16 and 17)

After that, the filling layer 160 that fills the recesses between the partition walls 120 are formed (FIG. 16). The color filters 170 and the transparent substrate 180 are then disposed, and thus, the display device 1 is obtained (FIG. 17).

The method of manufacturing the semiconductor device according to the first embodiment is as described above.

Although the lower layer portions include silicon nitride ($SiN_x$) in the above description, it is also possible to form the lower layer portions with a resin material such as silicon oxynitride ($SiO_xN_y$), polyimide resin, or acrylic resin, for example.

Second Embodiment

A second embodiment is a modification of the first embodiment. The second embodiment differs from the first embodiment in the structure of the upper layers of the partition walls. Except for the above aspect, the configuration is similar to that of the first embodiment.

Figure 18:
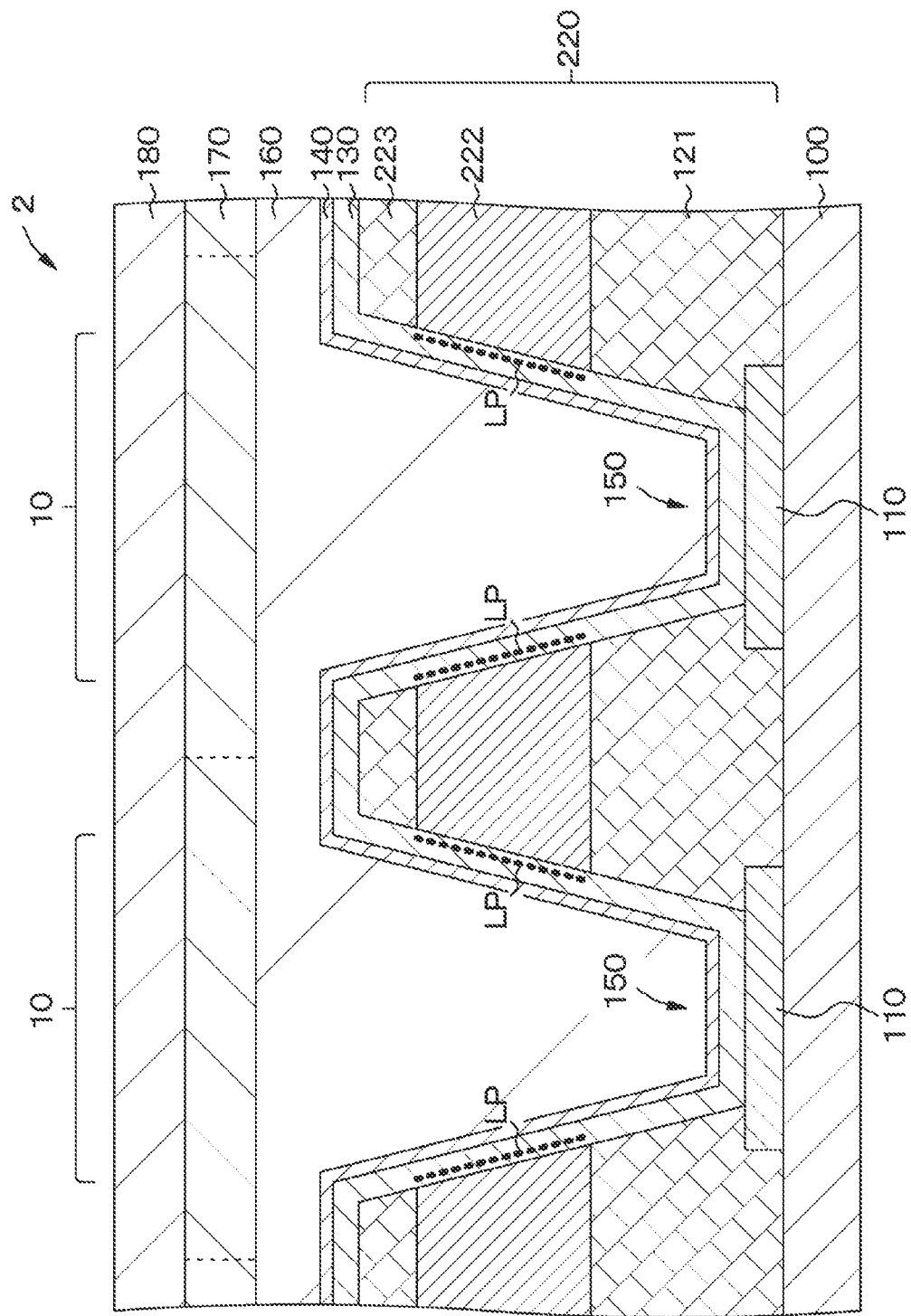
FIG. 18 is a schematic partial cross-sectional view of a display device according to a second embodiment of the present disclosure.

FIG. 18 is a schematic partial cross-sectional view of a display device according to the second embodiment of the present disclosure.

In the second embodiment, the upper layer portions of the partition walls each include a first upper layer portion on the lower layer portion side and a second upper layer portion above the first upper layer portion. Further, the second upper layer portion includes the same material as the material forming the lower layer portion.

In FIG. 18, a material layer 222 and a material layer 223 constitute the upper layer portion of a partition wall 220. Here, the material layer 222 includes a material similar to that of the material layer 122 of the first embodiment, and the material layer 223 includes a material similar to that of the material layer 121 of the first embodiment.

In this configuration, leakage paths are less likely to appear between the material layers 223 in the partition walls 220 and the organic layer 130. Accordingly, the effect to divide the leakage paths from one another becomes even greater.

Figure 19:
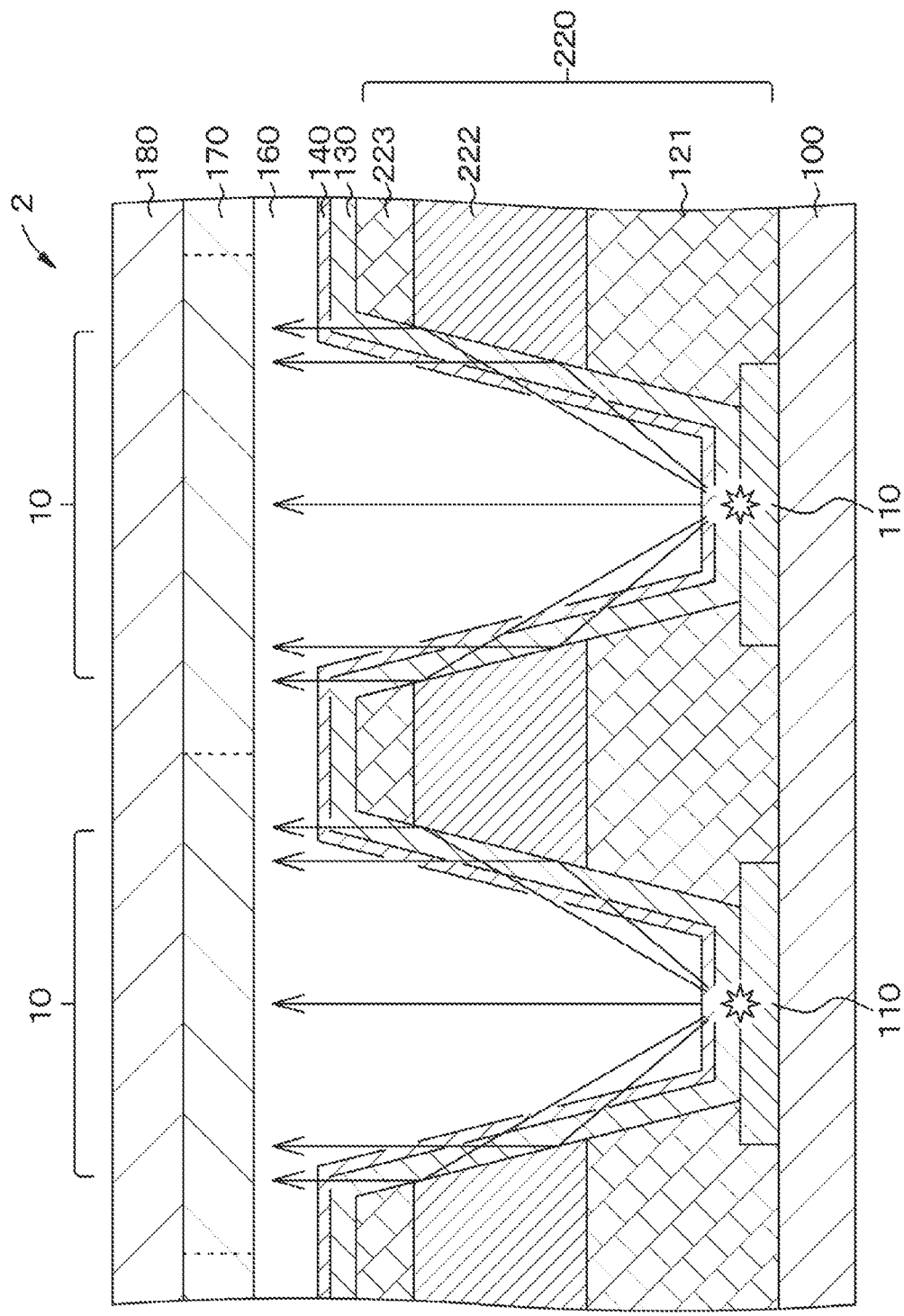
FIG. 19 is a schematic partial cross-sectional view for explaining light reflection in the display device according to the second embodiment.

FIG. 19 is a schematic partial cross-sectional view for explaining light reflection in the display device according to the second embodiment.

In the second embodiment, total reflection occurs primarily on the wall surfaces of the material layers 222. Therefore, if the material layers 223 are made thicker than necessary, the light extraction efficiency would become lower. In view of the above, it is preferable to set the thickness of the material layers 223 to the smallest possible value without causing any problem.

Next, a method of manufacturing a display device 2 according to the second embodiment of the present disclosure is described.

[Step 200] (see FIG. 20A)

First, the first electrodes 110 are formed on the substrate 100, as in [step 100] in the first embodiment.

[Step 210] (see FIG. 20B)

After that, a material layer for forming the partition walls 220 is formed. A material layer 121 that corresponds to the lower layer portions of the partition walls 220 and includes silicon nitride ($SiN_x$) is formed on the entire surface of the substrate 100 as well as on the first electrodes 110. The material layer 222 that corresponds to the upper layer portions of the partition walls 220 and includes silicon oxide ($SiO_x$) is formed thereon, and the material layer 223 including silicon nitride ($SiN_x$) is further formed.

The steps that follow are basically similar to [step 120] through [step 140] in the first embodiment. However, in the etching process for the upper layer portions of the partition walls, it is preferable to appropriately change the etching conditions, depending on the type of the material layer.

Third Embodiment

A third embodiment is a modification of the second embodiment. The third embodiment differs from the second embodiment in that the first upper layer portions each include a layer including the same material as the material forming the lower layer portions in the layer. Except for the above aspect, the configuration is similar to that of the first embodiment.

Figure 21:
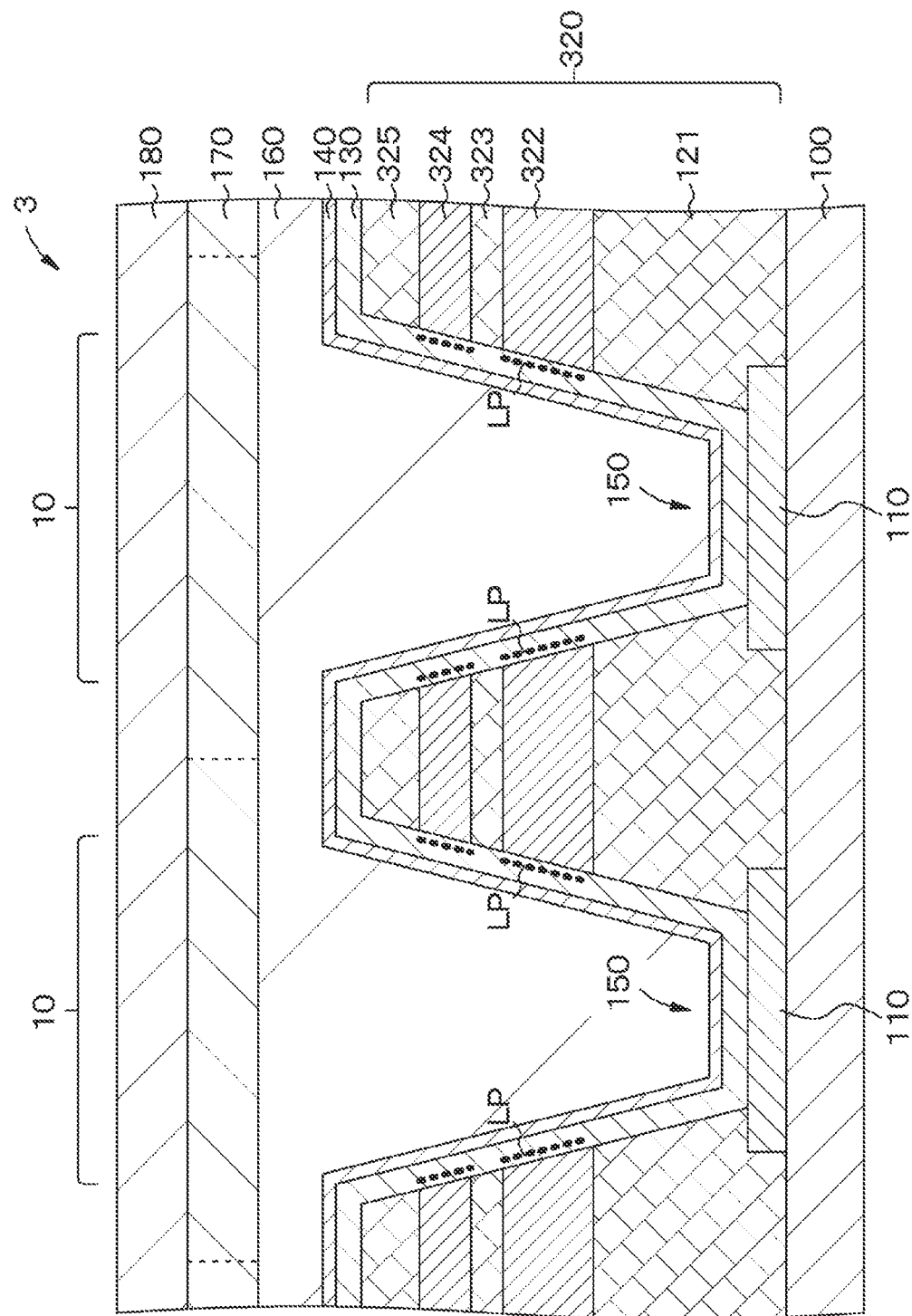
FIG. 21 is a schematic partial cross-sectional view of a display device according to a third embodiment of the present disclosure.

FIG. 21 is a schematic partial cross-sectional view of a display device according to the third embodiment of the present disclosure.

In the third embodiment, the upper layer portions of partition walls 320 each also include a first upper layer portion on the lower layer portion side and a second upper layer portion above the first upper layer portion. Further, the second upper layer portion includes the same material as the material forming the lower layer portion. Furthermore, the first upper layer portion includes a layer including the same material as the material forming the lower layer portion in the layer.

In FIG. 21, material layers 322, 323, 324, and 325 constitute the upper layer portion of a partition wall 320. Here, the material layers 322 and 324 include a material similar to that of the material layer 122 of the first embodiment, and the material layers 323 and 325 include a material similar to that of the material layer 121 of the first embodiment.

In this configuration, leakage paths are less likely to appear between the material layers 323 in the partition walls 320 and the organic layer 130. Accordingly, the effect to divide the leakage paths from one another becomes even greater.

In the second embodiment, total reflection occurs primarily on the wall surfaces of the material layers 322 and 324. Therefore, if the material layers 323 and 325 are made thicker than necessary, the light extraction efficiency would become lower. In view of the above, it is preferable to set the thicknesses of the material layers 323 and 325 to the smallest possible values without causing any problem.

Next, a method of manufacturing a display device 3 according to the third embodiment of the present disclosure is described.

Figure 22A:
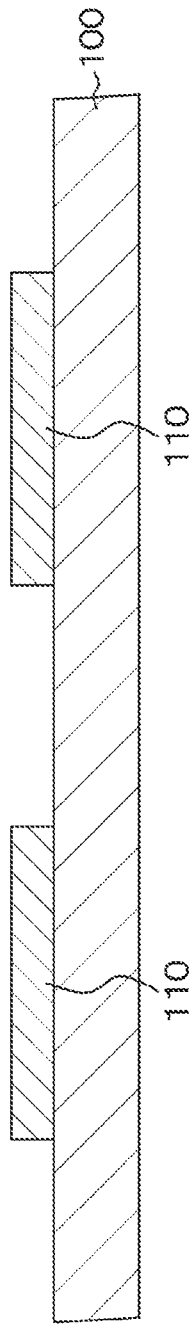
FIGS. 22A and 22B are schematic partial end views for explaining a method of manufacturing the display device according to the third embodiment.

[Step 300] (see FIG. 22A)

First, the first electrodes 110 are formed on the substrate 100, as in [step 100] in the first embodiment.

Figure 22B:
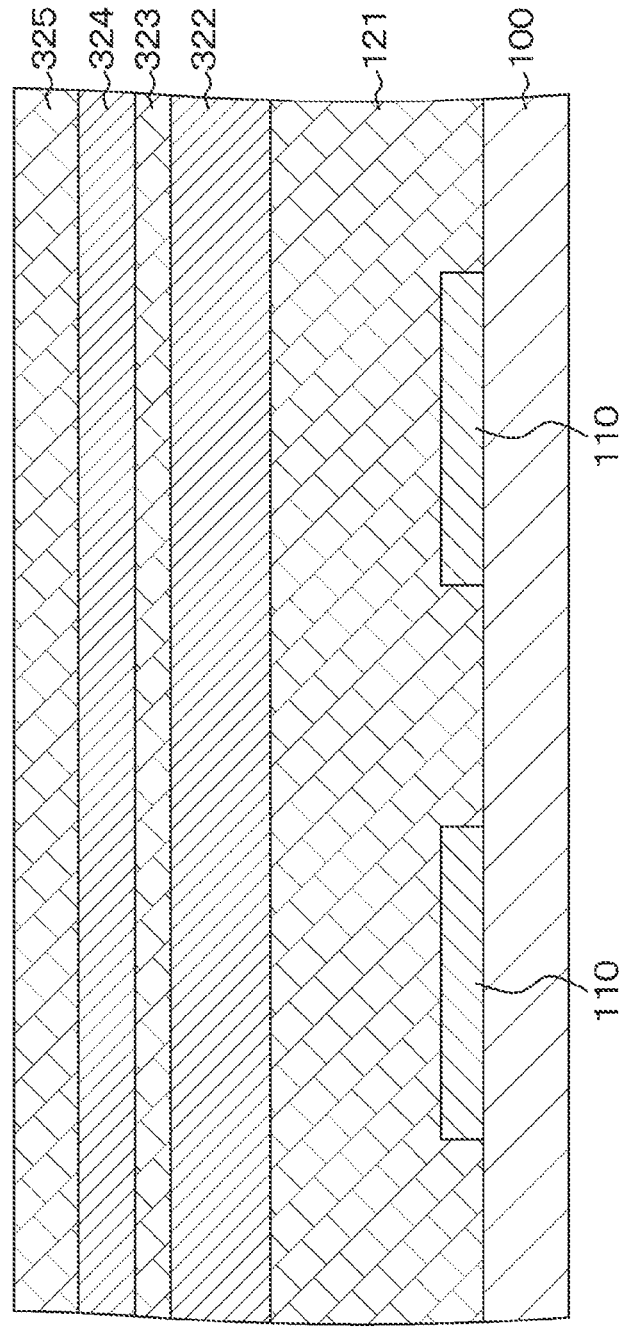

[Step 310] (see FIG. 22B)

After that, a material layer for forming the partition walls 320 is formed. A material layer 121 that corresponds to the lower layer portions of the partition walls 320 and includes silicon nitride ($SiN_x$) is formed on the entire surface of the substrate 100 as well as on the first electrodes 110. The material layer 322 that corresponds to the upper layer portions of the partition walls 320 and includes silicon oxide ($SiO_x$) is then formed thereon, the material layer 323 including silicon nitride ($SiN_x$) is further formed, the material layer 324 including ($SiO_x$) is formed, and the material layer 235 including silicon nitride ($SiN_x$) is further formed.

The steps that follow are basically similar to [step 120] through [step 140] in the first embodiment. However, in the etching process for the upper layer portions of the partition walls, it is preferable to appropriately change the etching conditions, depending on the type of the material layer.

[Electronic Apparatuses]

The above described display devices of the present disclosure can be used as display units (display devices) in electronic apparatuses in various fields in which video signals input to electronic apparatuses or video signals generated in electronic apparatuses are displayed as images or video images. In one example, a display device according to the present disclosure can be used as a display unit of a television set, a digital still camera, a notebook personal computer, a mobile terminal device such as a mobile telephone, a video camera, a head-mounted display (a display to be attached to the head), or the like, for example.

A display device of the present disclosure may be of a module type having a sealed configuration. In one example, a display device of the present disclosure is a display module formed by attaching a facing portion such as transparent glass to the pixel array unit. Note that the display module may be equipped with a circuit unit for inputting/outputting signals from the outside to the pixel array unit, a flexible printed circuit (FPC), and the like. In the description below, a digital still camera and head-mounted displays will be explained as specific examples of electronic apparatuses using a display device of the present disclosure. However, the specific examples described herein are merely an example, and are not limited thereto.

Specific Example 1

Figure 23A:
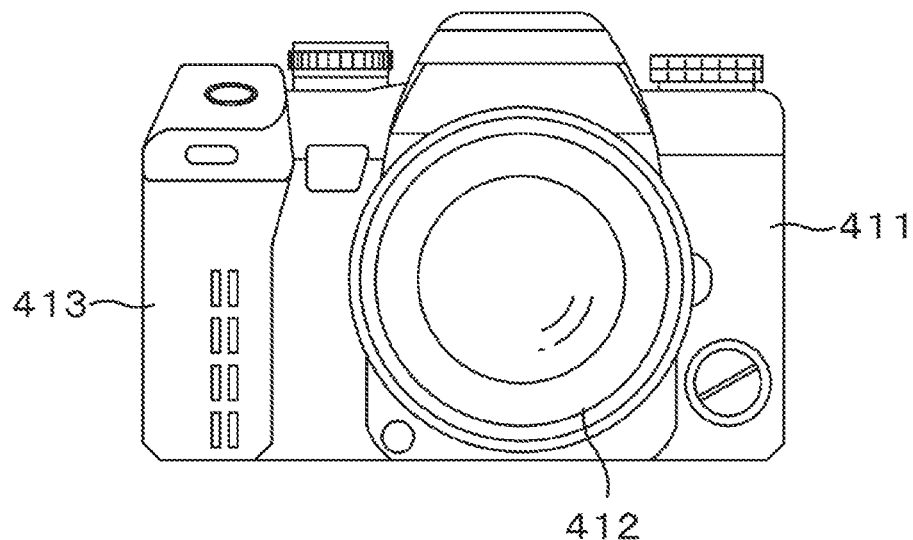
FIG. 23A shows a front view thereof.
Figure 23B:
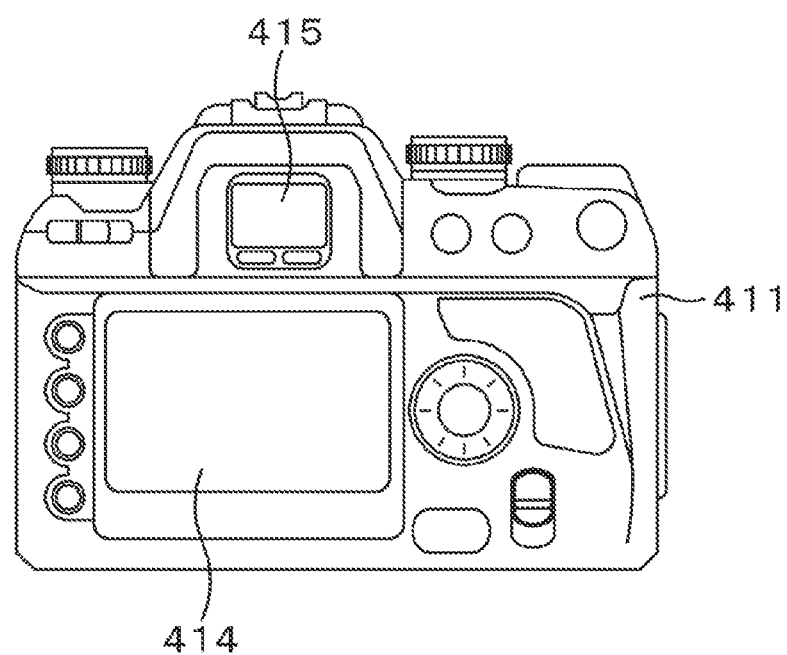
FIG. 23B shows a rear view thereof.

FIG. 23 is an external view of a single-lens reflex digital still camera with an interchangeable lens. FIG. 23A shows a front view of the digital still camera, and FIG. 23B shows a rear view of the digital still camera. The single-lens reflex digital still camera with an interchangeable lens includes an interchangeable imaging lens unit (an interchangeable lens) 412 on the front right side of a camera main unit (camera body) 411, and a grip portion 413 for the image-capturing person to grip on the front right side, for example.

Further, a monitor 414 is provided almost at the center of the back surface of the camera main unit 411. Above the monitor 414, a viewfinder (eyepiece window) 415 is provided. By looking through the viewfinder 415, the image-capturing person can visually recognize an optical image of the object guided from the imaging lens unit 412, and determine the composition.

In the single-lens reflex digital still camera with an interchangeable lens and the above configuration, a display device of the present disclosure can be used as the viewfinder 415. That is, the single-lens reflex digital still camera with an interchangeable lens according to this example is manufactured by using a display device of the present disclosure as the viewfinder 415.

Specific Example 2

Figure 24:
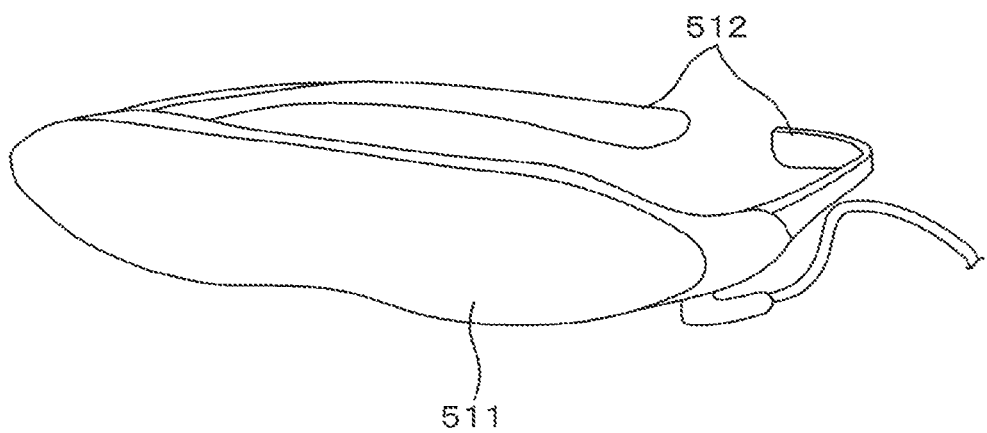
FIG. 24 is an external view of a head-mounted display.

FIG. 24 is an external view of a head-mounted display. The head-mounted display includes ear hook portions 512 on both sides of a display unit 511 in the form of eyeglasses, for example, and the ear hook portions 512 are designed for the user to attach the head-mounted display to the head. In this head-mounted display, a display device of the present disclosure can be used as the display unit 511. That is, the head-mounted display according to this example is manufactured by using a display device of the present disclosure as the display unit 511.

Specific Example 3

Figure 25:
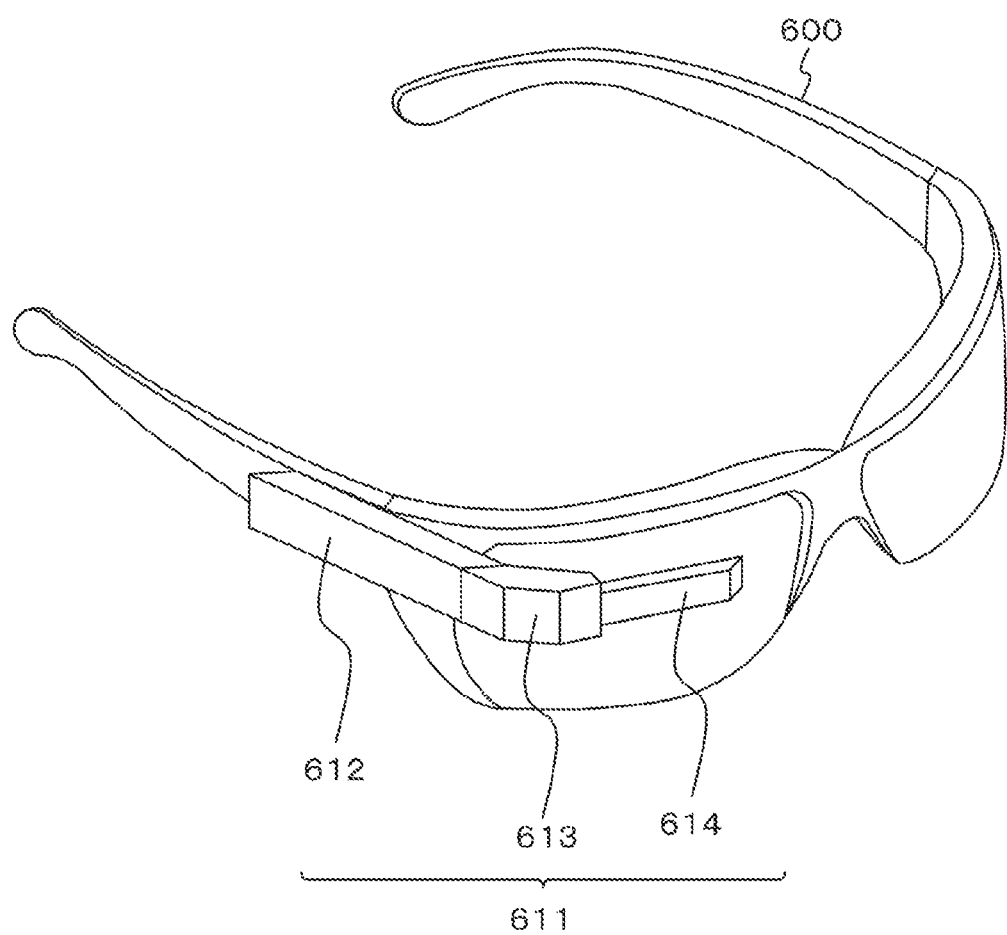
FIG. 25 is an external view of a see-through head-mounted display.

FIG. 25 is an external view of a see-through head-mounted display. A see-through head-mounted display 611 includes a main unit 612, an arm 613, and a lens tube 614.

The main unit 612 is connected to the arm 613 and glasses 600. Specifically, the end of the main unit 612 in the long-side direction is joined to the arm 613, and one of the side surfaces of the main unit 612 is joined to the glasses 600 via a connecting member. Note that the main unit 612 may be attached directly to the head of a person.

The main unit 612 contains a control board for controlling operation of the see-through head-mounted display 611, and a display unit. The arm 613 connects the main unit 612 and the lens tube 614, and supports the lens tube 614. Specifically, the arm 613 is joined to an end of the main unit 612 and an end of the lens tube 614, to secure the lens tube 614. Further, the arm 613 contains a signal line for communicating data relating to an image being provided from the main unit 612 to the lens tube 614.

The lens tube 614 projects image light provided from the main unit 612 via the arm 613, toward an eye of the user wearing the see-through head-mounted display 611 through the eyepiece, through an eyepiece. In this see-through head-mounted display 611, a display device of the present disclosure can be used as the display unit of the main unit 612.

Other Aspects

Note that the present disclosure can also have the configurations described below.

[A1]

A display device including light emitting units each formed by stacking a first electrode, an organic layer, and a second electrode, the light emitting units being formed and arranged in a two-dimensional matrix on a substrate, in which the first electrode is provided for each light emitting unit, partition walls are formed between adjacent first electrodes, the organic layer and the second electrode are stacked on an entire surface including a part over the first electrodes and a part over the partition walls, a filling layer filling recesses between the partition walls is formed on the second electrode, the partition walls include stacks each including at least two layers including a lower layer portion on a light emitting unit side and an upper layer portion located above the lower layer portion, and at least part of light entering from the light emitting units is totally reflected on surfaces of the upper layer portions of the partition walls.

[A2]

The display device according to [A1], in which the lower layer portions of the partition walls are disposed in regions in which light emitted from a position at the farthest distance from the partition walls in light emitted from the light emitting units is not totally reflected when all of the partition walls include a material forming the upper layer portions.

[A3]

The display device according to [A1] or [A2], in which
the upper layer portions of the partition walls include an inorganic oxide.

[A4]

The display device according to [A3], in which
the upper layer portions of the partition walls include silicon oxide.

[A5]

The display device according to any one of [A1] to [A4], in which
the lower layer portions of the partition walls include an inorganic nitride.

[A6]

The display device according to [A5], in which
the lower layer portions of the partition walls include silicon nitride.

[A7]

The display device according to any one of [A1] to [A4], in which
the lower layer portions of the partition walls include an inorganic oxynitride.

[A8]

The display device according to [A7], in which
the lower layer portions of the partition walls include silicon oxynitride.

[A9]

The display device according to any one of [A1] to [A4], in which
the lower layer portions of the partition walls include a resin material.

[A10]

The display device according to [A9], in which
the lower layer portions of the partition walls include polyimide resin or acrylic resin.

[A11]

The display device according to any one of [A1] to [A10], further including
color filters disposed above the light emitting units.

[A12]

The display device according to any one of [A1] to [A11], in which
the upper layer portions of the partition walls each include a first upper layer portion on a lower layer portion side and a second upper layer portion above the first upper layer portion, and
the second upper layer portion includes the same material as a material forming the lower layer portions.

[A13]

The display device according to [A12], in which
the first upper layer portions each include a layer including the same material as the material forming the lower layer portion in the layer.

[B1]

An electronic apparatus including a display device, in which
the display device includes
light emitting units each formed by stacking a first electrode, an organic layer, and a second electrode, the light emitting units being formed and arranged in a two-dimensional matrix on a substrate,
partition walls are formed between adjacent ones of the light emitting units,
a protective layer fills a space between the partition walls,
the partition walls include stacks each including at least two layers including a lower layer portion on a light emitting unit side and an upper layer portion located above the lower layer portion, and the lower layer portion includes a material having a higher refractive index than a material forming the upper layer portion, and
at least part of light from the light emitting units is totally reflected on surfaces of the upper layer portions of the partition walls.

[B2]

The electronic apparatus according to [B1], in which
the lower layer portions of the partition walls are disposed in regions in which light emitted from a position at the farthest distance from the partition walls in light emitted from the light emitting units is not totally reflected when all of the partition walls include the material forming the upper layer portions.

[B3]

The electronic apparatus according to [B1] or [B2], in which
the upper layer portions of the partition walls include an inorganic oxide.

[B4]

The electronic apparatus according to [B3], in which
the upper layer portions of the partition walls include silicon oxide.

[B5]

The electronic apparatus according to any one of [B1] to [B4], in which
the lower layer portions of the partition walls include an inorganic nitride.

[B6]

The electronic apparatus according to [B5], in which
the lower layer portions of the partition walls include silicon nitride.

[B7]

The electronic apparatus according to any one of [B1] to [B4], in which
the lower layer portions of the partition walls include an inorganic oxynitride.

[B8]

The electronic apparatus according to [B7], in which
the lower layer portions of the partition walls include silicon oxynitride.

[B9]

The electronic apparatus according to any one of [B1] to [B4], in which
the lower layer portions of the partition walls include a resin material.

[B10]

The electronic apparatus according to [B9], in which
the lower layer portions of the partition walls include polyimide resin or acrylic resin.

[B11]

The electronic apparatus according to any one of [B1] to [B10], further including
color filters disposed above the light emitting units.

[B12]

The electronic apparatus according to any one of [B1] to [B11], in which
the upper layer portions of the partition walls each include a first upper layer portion on a lower layer portion side and a second upper layer portion above the first upper layer portion, and
the second upper layer portion includes the same material as the material forming the lower layer portions.

[B13]

The electronic apparatus according to [B12], in which
the first upper layer portions each include a layer including the same material as a material forming the lower layer portion in the layer.

REFERENCE SIGNS LIST 1, 2, 3, 9 Display device
10 Subpixel
100 Substrate
110 First electrode
120, 220, 320, 920 Partition wall
121 Lower layer portion (material layer)
122 Upper layer portion (material layer)
222, 223, 322, 323, 324, 325 Material layer
130 Organic layer
140 Second electrode
150 Light emitting unit
160 Filling layer
170 Color filter
180 Transparent substrate
190 Mask portion (the material layer forming the mask portion)
200A First etching process
200B Second etching process
411 Camera main unit
412 Imaging lens unit
413 Grip portion
414 Monitor
415 Viewfinder
511 Eyeglass-shaped display unit
512 Ear hook portion
600 Glasses (eyewear)
611 See-through head-mounted display
612 Main unit
613 Arm
614 Lens tube
R Red display pixel
G Green display pixel
B Blue display pixel

The invention claimed is:

1. A display device comprising:
a substrate;
a plurality of light emitting units including a first light emitting unit and a second light emitting unit provided on the substrate, each of the plurality of the light emitting units including a first electrode, an organic later and a second electrode; and
a partition wall located between the first electrode of the first light emitting unit and the first electrode of the second light emitting unit, wherein
the partition wall includes a first insulating layer and a second insulating layer disposed on the first insulating layer,
a refractive index of the first insulating layer is higher than a refractive index of the second insulating layer, and
the first insulating layer is SiN or SiON and the second insulating layer is SiO.

2. The display device according to claim 1, further comprising;
a filling layer disposed on the second electrode.

3. The display device according to claim 1, wherein the organic layer of the first light emitting unit and the organic layer of the second light emitting unit are commonly disposed.

4. The display device according to claim 1, wherein the second electrode of the first light emitting unit and the second electrode of the second light emitting unit are commonly disposed.

5. The display device according to claim 1, wherein the partition wall further includes a third insulating layer disposed on a top surface of the second insulating layer and a fourth insulating layer disposed on a top surface of the third insulating layer.

6. The display device according to claim 5, wherein the partition wall further includes a fifth insulating layer disposed on the fourth insulating layer.

7. The display device according to claim 6, wherein the refractive index of the first insulating layer and a refractive index of the third insulating layer are same.

8. The display device according to claim 7, wherein the refractive index of the second insulating layer and a refractive index of the fourth insulating layer are same.

9. The display device according to claim 8, wherein the refractive index of the first insulating layer, the refractive index of the third insulating layer and a refractive index of the fifth insulating layer are same.

10. An electronic apparatus comprising the display device according to claim 1.

11. The electronic apparatus according to claim 10, further comprising:
a filling layer disposed on the second electrode.

12. The electronic apparatus according to claim 10, wherein the organic layer of the first light emitting unit and the organic layer of the second light emitting unit are commonly disposed.

13. The electronic apparatus according to claim 10, wherein the second electrode of the first light emitting unit and the second electrode of the second light emitting unit are commonly disposed.

14. The electronic apparatus according to claim 10, wherein the partition wall further includes a third insulating layer disposed on a top surface of the second insulating layer and a fourth insulating layer disposed on a top surface of the third insulating layer.

15. The electronic apparatus according to claim 14, wherein the partition wall further includes a fifth insulating layer disposed on the fourth insulating layer.

16. The electronic apparatus according to claim 15, wherein the refractive index of the first insulating layer and a refractive index of the third insulating layer are same.

17. The electronic apparatus according to claim 16, wherein the refractive index of the second insulating layer and a refractive index of the fourth insulating layer are same.

18. The electronic apparatus according to claim 17, wherein the refractive index of the first insulating layer, the refractive index of the third insulating layer and a refractive index of the fifth insulating layer are same.

* * * * *

UNITED STATES PATENT AND TRADEMARK OFFICE
CERTIFICATE OF CORRECTION

PATENT NO. : 11,793,036 B2
APPLICATION NO. : 17/745299
DATED : October 17, 2023
INVENTOR(S) : Tomokazu Ohchi It is certified that error appears in the above-identified patent and that said Letters Patent is hereby corrected as shown below:

In the Claims

Column 19, Line 50, Claim 1:
Please replace the word -- later -- with "layer"

Signed and Sealed this
Twelfth Day of December, 2023

Katherine Kelly Vidal
*Director of the United States Patent and Trademark Office*